United States Patent
Chen et al.

(10) Patent No.: US 11,120,585 B2
(45) Date of Patent: Sep. 14, 2021

(54) SYSTEMS AND METHODS FOR IMAGE RECONSTRUCTION

(71) Applicant: SHANGHAI UNITED IMAGING INTELLIGENCE CO., LTD., Shanghai (CN)

(72) Inventors: Zhang Chen, Cambridge, MA (US); Shanhui Sun, Cambridge, MA (US); Terrence Chen, Cambridge, MA (US)

(73) Assignee: SHANGHAI UNITED IMAGING INTELLIGENCE CO., LTD., Shanghai (CN)

( * ) Notice: Subject to any disclaimer, the term of this patent is extended or adjusted under 35 U.S.C. 154(b) by 99 days.

(21) Appl. No.: 16/699,092

(22) Filed: Nov. 28, 2019

(65) Prior Publication Data
US 2021/0166446 A1    Jun. 3, 2021

(51) Int. Cl.
*G06T 11/00* (2006.01)
*G06T 7/00* (2017.01)
*G06N 3/04* (2006.01)
*G06N 3/08* (2006.01)

(52) U.S. Cl.
CPC .............. *G06T 11/008* (2013.01); *G06N 3/04* (2013.01); *G06N 3/08* (2013.01); *G06T 7/0012* (2013.01); *G06T 2207/10088* (2013.01); *G06T 2207/20084* (2013.01); *G06T 2207/30004* (2013.01)

(58) Field of Classification Search
CPC ............... G06T 11/008; G06T 7/0012; G06T 2207/10088; G06T 2207/20084; G06T 2207/30004; G06N 3/04; G06N 3/08
See application file for complete search history.

(56) References Cited

U.S. PATENT DOCUMENTS

| | | | |
|---|---|---|---|
| 10,990,857 B2 * | 4/2021 | Lim | G06K 9/6257 |
| 2017/0016972 A1 * | 1/2017 | Bhat | G01R 33/54 |
| 2019/0213761 A1 * | 7/2019 | Rosen | A61B 5/0035 |
| 2020/0034998 A1 * | 1/2020 | Schlemper | A61B 5/055 |
| 2020/0072933 A1 * | 3/2020 | Ye | G01R 33/5615 |
| 2020/0134887 A1 * | 4/2020 | Zeng | G06N 3/088 |
| 2020/0294287 A1 * | 9/2020 | Schlemper | G06T 7/0012 |
| 2021/0035337 A1 * | 2/2021 | Kim | G16H 30/40 |

OTHER PUBLICATIONS

Zhu, Bo et al., Image reconstruction by domain-transform manifold learning, Nature, 555: 487-501, 2018.

* cited by examiner

*Primary Examiner* — Utpal D Shah
(74) *Attorney, Agent, or Firm* — Metis IP LLC

(57) ABSTRACT

The present disclosure relates to a system. The system may obtain a k-space dataset according to magnetic resonance (MR) signals acquired by a magnetic resonance imaging (MRI) scanner. The system may also generate, based on the k-space dataset using an image reconstruction model that includes a sequence sub-model and a domain translation sub-model, a reconstructed image by: inputting at least a part of the k-space dataset into the sequence sub-model; outputting, from the sequence sub-model, a feature representation of the k-space dataset; inputting the feature representation of the k-space dataset into the domain translation sub-model; and outputting, from the domain translation sub-model, the reconstructed image.

20 Claims, 10 Drawing Sheets

SYSTEMS AND METHODS FOR IMAGE RECONSTRUCTION

TECHNICAL FIELD

The present disclosure generally relates to image reconstruction for a magnetic resonance imaging (MRI) system, and more specifically relates to systems and methods for reconstructing a magnetic resonance (MR) image based on machine learning techniques.

BACKGROUND

Magnetic resonance imaging (MRI) presents a wide range of applications by offering a non-invasive visualization of the anatomy of a subject or a part thereof. Currently, an MRI image is reconstructed based on a k-space dataset corresponding to MR signals. In practice, if the k-space dataset is fully sampled, the data acquisition speed of the k-space dataset is slow, which makes an MRI scan time-consuming and increases the discomfort of a subject being scanned. Sub-sampling may accelerate the speed of data acquisition. Image reconstruction may be performed based on a sub-sampled k-space dataset using an inverse Fourier transform technique. The acceleration of the data acquisition may be achieved at the expense of sacrificing some quality of the reconstructed image by, e.g., introducing artifacts including, e.g., aliasing artifacts. Thus, it is desirable to provide systems and methods for efficiently reconstructing a high-quality magnetic resonance (MR) image using a sub-sampled k-space dataset.

SUMMARY

In a first aspect of the present disclosure, a system may be provided. The system may include at least one storage device including a set of instructions and at least one processor in communication with the at least one storage device. When executing the set of instructions, the at least one processor may be configured to cause the system to perform operations including: obtaining a k-space dataset according to magnetic resonance (MR) signals acquired by a magnetic resonance imaging (MRI) scanner generating, based on the k-space dataset using an image reconstruction model that includes a sequence sub-model and a domain translation sub-model, a reconstructed image by: inputting at least a part of the k-space dataset into the sequence sub-model; outputting, from the sequence sub-model, a feature representation of the k-space dataset; inputting the feature representation of the k-space dataset into the domain translation sub-model; and outputting, from the domain translation sub-model, the reconstructed image.

In some embodiments, the k-space dataset may include a sub-sampled k-space dataset.

In some embodiments, the at least one processor may be further configured to cause the system to perform the operations including: reshaping the k-space dataset to a vector including a series of data points based on the k-space dataset.

In some embodiments, the inputting the at least a part of the k-space dataset into the sequence sub-model may include sequentially inputting at least a part of the vector into the sequence sub-model.

In some embodiments, the at least one processor may be further configured to cause the system to perform operations including: generating a second vector including sub-sampling information of data points of the at least a part of the vector; generating a third vector including first coordinates of data points of the at least a part of the vector; generating a fourth vector including second coordinates of data points of the at least a part of the vector; or generating a fifth vector including third coordinates of data points of the at least a part of the vector.

In some embodiments, the k-space dataset may include a plurality of data points each of which includes a complex value represented as a data point in the vector.

In some embodiments, each data point in the vector may be represented in a form of a real part of the complex value and an imaginary part of the complex value.

In some embodiments, the k-space dataset may include a plurality of data points each of which includes a phase component and a magnitude component together represented as a data point in the vector.

In some embodiments, the k-space dataset may include a plurality of data points arranged in a matrix, and the reshaping the k-space dataset to a vector including a series of data points based on the k-space dataset may include: retrieving the plurality of data points of the k-space dataset by row or by column.

In some embodiments, the sequentially inputting at least a part of the vector into the sequence sub-model may include: determining the at least a part of the vector by removing, from the series of data points and based on the sub-sampling information, data points of the vector corresponding to unsampled data points in the k-space dataset.

In some embodiments, the at least one processor may be further configured to cause the system to perform operations including: concatenating the vector, the second vector, the third vector, the fourth vector, and the fifth vector; and sequentially inputting at least a part of the concatenated vectors into the sequence sub-model.

In some embodiments, the inputting at least a part of the k-space dataset into the sequence sub-model may include: inputting at least a part of the k-space dataset in a form of a vector, a matrix, or a tensor into the sequence sub-model.

In some embodiments, the inputting at least a part of the k-space dataset into the sequence sub-model may include: obtaining a concatenated vector, matrix, or tensor by concatenating at least a part of a plurality of data points in the k-space dataset and characteristic information thereof; and sequentially inputting at least a part of the concatenated vector, matrix, or tensor into the sequence sub-model.

In some embodiments, the characteristic information may include sub-sampling information of the at least a part of the plurality of data points, first coordinates of the at least a part of the plurality of data points, second coordinates of the at least a part of the plurality of data points, or third coordinates of the at least a part of the plurality of data points.

In some embodiments, the sequence sub-model may include at least one of a simple recurrent unit (SRU), a gated unit, a long-short-term memory (LSTM) unit, an attention layer, or a bi-direction recurrent unit.

In some embodiments, the image reconstruction model may include at least one of a recurrent neural network (RNN) model, a simple recurrent network (SRN) model, a gated sequence model, an LSTM network model, a stacked recurrent neural network (SRNN) model, a bi-directional recurrent network model, a recursive neural network (RecNN) model, a graph network model, a convolutional neural network (CNN) model, a transformer, a transformer XL, a bidirectional encoder representation from transformer (BERT), a fully convolutional neural network (FCN) model, a generative adversarial network (GAN) model, a back propagation (BP) neural network model, a radial basis function (RBF) neural network model, a deep belief nets (DBN) neural network model, or an Elman neural network model.

In some embodiments, the sequence sub-model and the domain translation sub-model may include a skip-connection structure.

In some embodiments, the skip-connection structure may include a convolutional layer.

In some embodiments, the image reconstruction model may be generated by a training process including: obtaining a plurality of training k-space datasets; and generating the image reconstruction model by training, based on the plurality of training k-space datasets, a preliminary image reconstruction model.

In some embodiments, the plurality of training k-space datasets may include one or more sub-sampled training k-space datasets.

In some embodiments, the preliminary image reconstruction model may include a preliminary sequence sub-model and a preliminary domain translation sub-model, and the generating the image reconstruction model by training, based on the plurality of training k-space datasets may include: for each of at least one of the plurality of training k-space datasets, inputting at least a part of the training k-space dataset into an intermediate sequence sub-model that relates to the preliminary sequence sub-model; outputting, from the intermediate sequence sub-model, a training feature representation of the training k-space dataset; inputting the training feature representation of the training k-space dataset into an intermediate domain translation sub-model that relates to the preliminary domain translation sub-model; outputting, from the intermediate domain translation sub-model, a reconstructed training image; obtaining a comparison result by comparing the reconstructed training image and a reference reconstructed image corresponding to the training k-space dataset; and determining whether a predetermined condition is satisfied; and updating at least one of the intermediate sequence sub-model or the intermediate domain translation sub-model based on the comparison result; and obtaining the image reconstruction model in response to determining that the predetermined condition is satisfied.

In some embodiments, the at least one processor may be further configured to cause the system to perform the operations including: obtaining a training vector including a series of training data points corresponding to each training k-space dataset.

In some embodiments, the generating the image reconstruction model by training, based on the plurality of training k-space datasets, a preliminary image reconstruction model may further include: for each of the plurality of training vectors, generating a second training vector including training sub-sampling information of training data points of the at least a part of the training vector; generating a third training vector including first coordinates of training data points of the at least a part of the training vector; generating a fourth training vector including second coordinates of training data points of the at least a part of the training vector; or generating a fifth training vector including third coordinates of training data points of the at least a part of the training vector.

In some embodiments, the obtaining a training vector including a series of training data points corresponding to each training k-space dataset may include: concatenating the training vector, the second training vector, the third training vector, the fourth training vector, and the fifth training vector for each of the plurality of training vectors.

In some embodiments, the image reconstruction model may be further configured to reduce noise in a reconstructed image; and the generating the image reconstruction model by training, based on the plurality of training k-space datasets, a preliminary image reconstruction model may include: reducing noise of the reference reconstructed image; and generating the image reconstruction model based on the reference reconstructed image with reduced noise.

In a second aspect of the present disclosure, a method for reconstructing an image may be provided. The method may be implemented on a computing device having at least one processor, and at least one computer-readable storage medium. The method may include: obtaining a k-space dataset according to magnetic resonance (MR) signals acquired by a magnetic resonance imaging (MRI) scanner; generating, based on the k-space dataset using an image reconstruction model that includes a sequence sub-model and a domain translation sub-model, a reconstructed image by: inputting at least a part of the k-space dataset into the sequence sub-model; outputting, from the sequence sub-model, a feature representation of the k-space dataset; inputting the feature representation of the k-space dataset into the domain translation sub-model; and outputting, from the domain translation sub-model, the reconstructed image.

In some embodiments, the k-space dataset may include a sub-sampled k-space dataset.

In some embodiments, the method may further include: reshaping the k-space dataset to a vector including a series of data points based on the k-space dataset.

In some embodiments, the inputting the at least a part of the k-space dataset into the sequence sub-model may include: sequentially inputting at least a part of the vector into the sequence sub-model.

In some embodiments, the method may further include: generating a second vector including sub-sampling information of data points of the at least a part of the vector; generating a third vector including first coordinates of data points of the at least a part of the vector; generating a fourth vector including second coordinates of data points of the at least a part of the vector; or generating a fifth vector including third coordinates of data points of the at least a part of the vector.

In some embodiments, the k-space dataset may include a plurality of data points each of which includes a complex value represented as a data point in the vector.

In some embodiments, each data point in the vector may be represented in a form of a real part of the complex value and an imaginary part of the complex value.

In some embodiments, the k-space dataset may include a plurality of data points each of which includes a phase component and a magnitude component together represented as a data point in the vector.

In some embodiments, the k-space dataset may include a plurality of data points arranged in a matrix, and the reshaping the k-space dataset to a vector including a series of data points based on the k-space dataset may include retrieving the plurality of data points of the k-space dataset by row or by column.

In some embodiments, the sequentially inputting at least a part of the vector into the sequence sub-model may include: determining the at least a part of the vector by removing, from the series of data points and based on the sub-sampling information, data points of the vector corresponding to unsampled data points in the k-space dataset.

In some embodiments, the method may further include: concatenating the vector, the second vector, the third vector, the fourth vector, and the fifth vector; and sequentially inputting at least a part of the concatenated vectors into the sequence sub-model.

In some embodiments, the inputting at least a part of the k-space dataset into the sequence sub-model may include: inputting at least a part of the k-space dataset in a form of a vector, a matrix, or a tensor into the sequence sub-model.

In some embodiments, the inputting at least a part of the k-space dataset into the sequence sub-model may include: obtaining a concatenated vector, matrix, or tensor by concatenating at least a part of a plurality of data points in the k-space dataset and characteristic information thereof; and sequentially inputting at least a part of the concatenated vector, matrix, or tensor into the sequence sub-model.

In some embodiments, the characteristic information may include sub-sampling information of the at least a part of the plurality of data points, first coordinates of the at least a part of the plurality of data points, second coordinates of the at least a part of the plurality of data points, or third coordinates of the at least a part of the plurality of data points.

In some embodiments, the sequence sub-model may include at least one of a simple recurrent unit (SRU), a gated unit, a long-short-term memory (LSTM) unit, an attention layer, or a bi-direction recurrent unit.

In some embodiments, the image reconstruction model may include at least one of a recurrent neural network (RNN) model, a simple recurrent network (SRN) model, a gated sequence model, an LSTM network model, a stacked recurrent neural network (SRNN) model, a bi-directional recurrent network model, a recursive neural network (RecNN) model, a graph network model, a convolutional neural network (CNN) model, a transformer, a transformer XL, a bidirectional encoder representation from transformer (BERT), a fully convolutional neural network (FCN) model, a generative adversarial network (GAN) model, a back propagation (BP) neural network model, a radial basis function (RBF) neural network model, a deep belief nets (DBN) neural network model, or an Elman neural network model.

In some embodiments, the sequence sub-model and the domain translation sub-model may include a skip-connection structure.

In some embodiments, the skip-connection structure may include a convolutional layer.

In some embodiments, the image reconstruction model may be generated by a training process including: obtaining a plurality of training k-space datasets; and generating the image reconstruction model by training, based on the plurality of training k-space datasets, a preliminary image reconstruction model.

In some embodiments, the plurality of training k-space datasets may include one or more sub-sampled training k-space datasets.

In some embodiments, the preliminary image reconstruction model may include a preliminary sequence sub-model and a preliminary domain translation sub-model, and the generating the image reconstruction model by training, based on the plurality of training k-space datasets may include: for each of at least one of the plurality of training k-space datasets, inputting at least a part of the training k-space dataset into an intermediate sequence sub-model that relates to the preliminary sequence sub-model; outputting, from the intermediate sequence sub-model, a training feature representation of the training k-space dataset; inputting the training feature representation of the training k-space dataset into an intermediate domain translation sub-model that relates to the preliminary domain translation sub-model; outputting, from the intermediate domain translation sub-model, a reconstructed training image; obtaining a comparison result by comparing the reconstructed training image and a reference reconstructed image corresponding to the training k-space dataset; and determining whether a predetermined condition is satisfied; and updating at least one of the intermediate sequence sub-model or the intermediate domain translation sub-model based on the comparison result; and obtaining the image reconstruction model in response to determining that the predetermined condition is satisfied.

In some embodiments, the method may further include: obtaining a training vector including a series of training data points corresponding to each training k-space dataset.

In some embodiments, the generating the image reconstruction model by training, based on the plurality of training k-space datasets, a preliminary image reconstruction model may further include: for each of the plurality of training vectors, generating a second training vector including training sub-sampling information of training data points of the at least a part of the training vector; generating a third training vector including first coordinates of training data points of the at least a part of the training vector; generating a fourth training vector including second coordinates of training data points of the at least a part of the training vector; or generating a fifth training vector including third coordinates of training data points of the at least a part of the training vector.

In some embodiments, the obtaining a training vector including a series of training data points corresponding to each training k-space dataset may include: concatenating the training vector, the second training vector, the third training vector, the fourth training vector, and the fifth training vector for each of the plurality of training vectors.

In some embodiments, the image reconstruction model may be further configured to reduce noise in a reconstructed image; and the generating the image reconstruction model by training, based on the plurality of training k-space datasets may include: reducing noise of the reference reconstructed image; and generating the image reconstruction model based on the reference reconstructed image with reduced noise.

In a third aspect of the present disclosure, a system may be provided. The system may include at least one storage device including a set of instructions and at least one processor in communication with the at least one storage device. When executing the set of instructions, the at least one processor may be configured to cause the system to perform operations including: obtaining a plurality of training k-space datasets; and generating an image reconstruction model by training, based on the plurality of training k-space datasets, a preliminary image reconstruction model.

In a fourth aspect of the present disclosure, a method for generating an image reconstruction model may be provided. The method may be implemented on a computing device having at least one processor, and at least one computer-readable storage medium. The method may include: obtaining a plurality of training k-space datasets; and generating the image reconstruction model by training, based on the plurality of training k-space datasets, a preliminary image reconstruction model.

In a fifth aspect of the present disclosure, a non-transitory computer readable medium may be provided. The non-transitory computer readable medium may include instructions being executed by at least one processor, causing the at least one processor to implement a method. The method may include: obtaining a k-space dataset according to magnetic resonance (MR) signals acquired by a magnetic resonance imaging (MRI) scanner; generating, based on the k-space dataset using an image reconstruction model that includes a sequence sub-model and a domain translation sub-model, a reconstructed image by: inputting at least a part of the k-space dataset into the sequence sub-model; outputting, from the sequence sub-model, a feature representation of the k-space dataset; inputting the feature representation of the k-space dataset into the domain translation sub-model; and outputting, from the domain translation sub-model, the reconstructed image.

Additional features will be set forth in part in the description which follows, and in part will become apparent to those skilled in the art upon examination of the following and the accompanying drawings or may be learned by production or operation of the examples. The features of the present disclosure may be realized and attained by practice or use of various aspects of the methodologies, instrumentalities and combinations set forth in the detailed examples discussed below.

BRIEF DESCRIPTION OF THE DRAWINGS

The present disclosure is further described in terms of exemplary embodiments. These exemplary embodiments are described in detail with reference to the drawings. The drawings are not to scale. These embodiments are non-limiting exemplary embodiments, in which like reference numerals represent similar structures throughout the several views of the drawings, and wherein.

DETAILED DESCRIPTION

In the following detailed description, numerous specific details are set forth by way of examples in order to provide a thorough understanding of the relevant disclosure. However, it should be apparent to those skilled in the art that the present disclosure may be practiced without such details. In other instances, well-known methods, procedures, systems, components, and/or circuitry have been described at a relatively high-level, without detail, in order to avoid unnecessarily obscuring aspects of the present disclosure. Various modifications to the disclosed embodiments will be readily apparent to those skilled in the art, and the general principles defined herein may be applied to other embodiments and applications without departing from the spirit and scope of the present disclosure. Thus, the present disclosure is not limited to the embodiments shown, but to be accorded the widest scope consistent with the claims.

The terminology used herein is for the purpose of describing particular example embodiments only and is not intended to be limiting. As used herein, the singular forms "a," "an," and "the" may be intended to include the plural forms as well, unless the context clearly indicates otherwise. It will be further understood that the terms "comprise," "comprises," and/or "comprising," "include," "includes," and/or "including," when used in this specification, specify the presence of stated features, integers, steps, operations, elements, and/or components, but do not preclude the presence or addition of one or more other features, integers, steps, operations, elements, components, and/or groups thereof.

It will be understood that the term "system," "unit," "module," and/or "block" used herein are one method to distinguish different components, elements, parts, section or assembly of different level in ascending order. However, the terms may be displaced by another expression if they achieve the same purpose.

Figure 3:
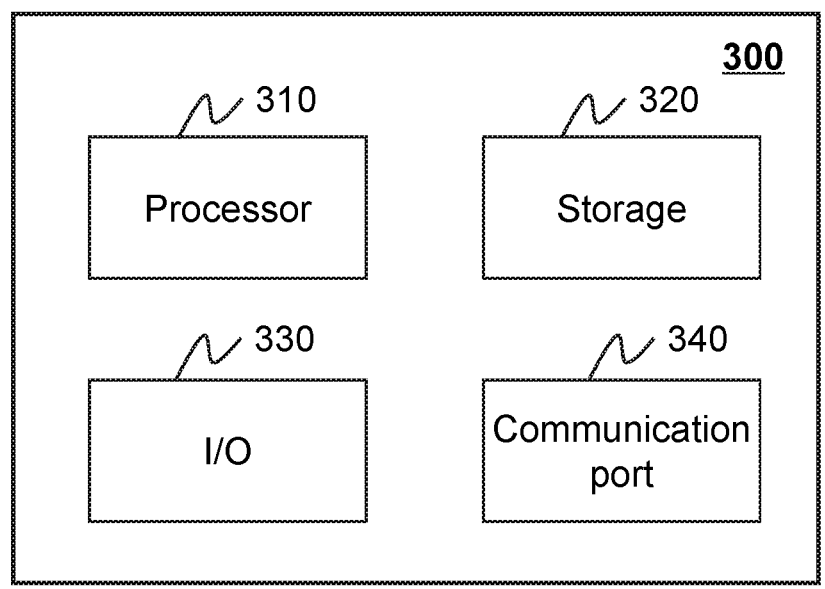
FIG. 3 is a schematic diagram illustrating exemplary hardware and/or software components of a computing device according to some embodiments of the present disclosure.

Generally, the word "module," "unit," or "block," as used herein, refers to logic embodied in hardware or firmware, or to a collection of software instructions. A module, a unit, or a block described herein may be implemented as software and/or hardware and may be stored in any type of non-transitory computer-readable medium or another storage device. In some embodiments, a software module/unit/block may be compiled and linked into an executable program. It will be appreciated that software modules can be callable from other modules/units/blocks or from themselves, and/or may be invoked in response to detected events or interrupts. Software modules/units/blocks configured for execution on computing devices (e.g., processor 310 as illustrated in FIG. 3) may be provided on a computer readable medium, such as a compact disc, a digital video disc, a flash drive, a magnetic disc, or any other tangible medium, or as a digital download (and can be originally stored in a compressed or installable format that needs installation, decompression, or decryption prior to execution). Such software code may be stored, partially or fully, on a storage device of the executing computing device, for execution by the computing device. Software instructions may be embedded in firmware, such as an EPROM. It will be further appreciated that hardware modules/units/blocks may be included of connected logic components, such as gates and flip-flops, and/or can be included of programmable units, such as programmable gate arrays or processors. The modules/units/blocks or computing device functionality described herein may be implemented as software modules/units/blocks, but may be represented in hardware or firmware. In general, the modules/units/blocks described herein refer to logical modules/units/blocks that may be combined with other modules/units/blocks or divided into sub-modules/sub-units/sub-blocks despite their physical organization or storage.

It will be understood that when a unit, engine, module or block is referred to as being "on," "connected to," or "coupled to," another unit, engine, module, or block, it may be directly on, connected or coupled to, or communicate with the other unit, engine, module, or block, or an intervening unit, engine, module, or block may be present, unless the context clearly indicates otherwise. As used herein, the term "and/or" includes any and all combinations of one or more of the associated listed items.

These and other features, and characteristics of the present disclosure, as well as the methods of operation and functions of the related elements of structure and the combination of parts and economies of manufacture, may become more apparent upon consideration of the following description with reference to the accompanying drawings, all of which form a part of this disclosure. It is to be expressly understood, however, that the drawings are for the purpose of illustration and description only and are not intended to limit the scope of the present disclosure. It is understood that the drawings are not to scale.

Provided herein are systems and components for medical imaging and/or medical treatment. In some embodiments, the medical system may include an imaging system. The imaging system may include a single modality imaging system and/or a multi-modality imaging system. The single modality imaging system may include, for example, a magnetic resonance imaging (MRI) system. Exemplary MRI systems may include a superconducting magnetic resonance imaging system, a non-superconducting magnetic resonance imaging system, etc. The multi-modality imaging system may include, for example, a computed tomography-magnetic resonance imaging (MRI-CT) system, a positron emission tomography-magnetic resonance imaging (PET-MRI) system, a single photon emission computed tomography-magnetic resonance imaging (SPECT-MRI) system, a digital subtraction angiography-magnetic resonance imaging (DSA-MRI) system, etc. In some embodiments, the medical system may include a treatment system. The treatment system may include a treatment plan system (TPS), image-guided radiotherapy (IGRT), etc. The image-guided radiotherapy (IGRT) may include a treatment device and an imaging device. The treatment device may include a linear accelerator, a cyclotron, a synchrotron, etc., configured to perform radiotherapy on a subject. The treatment device may include an accelerator of species of particles including, for example, photons, electrons, protons, or heavy ions. The imaging device may include an MRI scanner, a CT scanner (e.g., cone beam computed tomography (CBCT) scanner), a digital radiology (DR) scanner, an electronic portal imaging device (EPID), etc.

An aspect of the present disclosure relates to systems and methods for reconstructing an MR image. As used herein, an image so acquired (e.g., a reconstructed MR image) may include a 2D image slice, a 3D image (e.g., a 3D image including a stack of 2D image slices), a 4D image including a time series of 2D or 3D images (e.g., a video). A k-space dataset may be obtained according to MR signals acquired by an MRI scanner. A reconstructed image (e.g., a video) may be generated based on the k-space dataset using an image reconstruction model. The image reconstruction model may include a sequence sub-model and a domain translation sub-model. The sequence sub-model may be configured to determine a feature representation of the k-space dataset. The domain translation sub-model may be configured to generate the reconstructed image (e.g., a video) based on the feature representation of the k-space dataset.

Currently, a sequence model (e.g., a CNN model, an RNN model), or referred to herein as a sequence sub-model, may extract feature representations from shorter segments of an overall input dataset. The sequence model may determine the output of the input dataset based on the extracted feature representations. In some embodiments, the sequence sub-model (e.g., an RNN model) may be a connectionist model configured to sequentially process an input dataset including a plurality of data points related with each other in time and/or space. For example, the input dataset may include a sequence of $(x_1, x_2, \ldots, x_i, \ldots, x_n)$. For $x_1$, a recurrent unit (e.g., a simple recurrent unit) of the RNN model may determine a first feature representation based on $x_1$. For $x_2$, the recurrent unit may determine a second feature representation based on the first feature representation and $x_2$. Similarly, for $x_n$, the recurrent unit may determine an $n^{th}$ feature representation based on an $(n-1)_{th}$ feature representation and $x_n$.

The sequence model may determine the output of the input dataset based on the $n^{th}$ feature representation. In this way, the consumption of memory may be reduced compared to a machine learning model (e.g., an AUTOMAP model) that uses one or more fully connected layers to extract an entire feature representation of the input dataset. Usually, the sequence model may be used for language processing (e.g., translation), speech processing (e.g., speech recognition, speech synthesis), time series prediction, etc.

According to some embodiments of the present disclosure, at least a part of the k-space dataset may be input to the sequence sub-model and the domain translation sub-model for collaboratively reconstructing an MR image (e.g., a video). The sequence sub-model may extract a feature representation of the k-space dataset, or a part thereof, in the k-space domain. The domain translation sub-model may map the feature representation in the k-space domain into the image domain, and then determine the reconstructed MR image (e.g., a video). In this way, the consumption of memory (e.g., video memory if a graphic processing unit (GPU) is used to perform the processing) may be reduced compared to a machine learning model (e.g., an AUTOMAP model) that uses an input that has a fixed length and/or uses one or more fully connected layers to extract the feature representation of the k-space dataset for image reconstruction. In some cases, the k-space dataset may be sub-sampled; at least a part of the sub-sampled k-space dataset may be selectively omitted (e.g., data points of the sub-sampled k-space dataset that are not sampled may be omitted in the features extraction and image reconstruction), thereby further reducing the consumption of memory.

According to some embodiments of the present disclosure, a k-space dataset may include a plurality of data points that are related with each other in space. For instance, the k-space dataset may further be reformatted to the form of a vector including a plurality of data points resembling the format of a time series of data points. Different types of additional information (e.g., characteristic information including location information, timing information) of the data points may also be reformatted to the form of vectors resembling the format of the time series of data points, respectively. In some cases, the vectors may include the location information of data points of the at least a part of the k-space dataset such that the vectors can be generated by reshaping thereof randomly instead of reshaping thereof in a fixed order. The k-space dataset in the form of vectors or matrix, or a part thereof, may be sequentially input to the sequence sub-model (e.g., the RNN model) and the domain translation sub-model together for reconstructing the MR image (e.g., a video). The sequential or serial processing of the k-space dataset may allow flexibility in terms of the pace or step-length of the sequential or serial processing. For instance, different paces or step-lengths may be achieved by selecting the amount of data points (e.g., in the form of vectors or matrix) to be input into the sequence sub-model each operation of the serial processing. An image reconstruction model, or a portion thereof, may be used to process k-space datasets of various sizes and/or dimensions including different amounts of data points, compared to a machine learning model (e.g., an AUTOMAP model) that uses one or more fully connected layers to extract an entire feature representation of input datasets and is therefore applicable to process input datasets of a same size and/or dimension including a same amount of data points (e.g., only input datasets in the form of a 512×512 matrix).

In some cases, the sequence sub-model and the domain translation sub-model may include one or more skip-connection structures. The skip-connection structure(s) may allow an additional feature representation of the k-space dataset and/or the additional information or a part thereof to be transmitted from the sequence sub-model to the domain translation sub-model, thereby determining the reconstructed image (e.g., video) based on the feature representation, the additional feature representation, and/or the additional information or a part thereof together. Such additional information may include characteristic information of the data points including, e.g., sub-sampling information of the k-space dataset, location information of the k-space dataset, timing information of the k-space dataset, etc.

According to some embodiments of the present disclosure, the sequence sub-model and the domain translation sub-model may be generated by training a preliminary sequence sub-model and a preliminary domain translation sub-model based on the plurality of training k-space datasets. During the training, a reference image (e.g., a video) reconstructed based on a reference k-space dataset that is fully sampled may be a desired output of the preliminary domain translation sub-model. Accordingly, the reconstructed image (e.g., a video) generated using the sequence sub-model and the domain translation sub-model based on the sub-sampled k-space dataset may have fewer artifacts compared to a reconstructed image (e.g., a video) generated using an inverse Flourier transform technique based on the same sub-sampled k-space dataset.

In some cases, the noise of the reference image (e.g., a video) may be reduced based on a noise reduction technique. During the training, the reference image (e.g., a video) with less noise may be a desired output of the preliminary domain translation sub-model. Thus, the sequence sub-model and the domain translation sub-model so trained may also be configured to reduce noise in the reconstructed image (e.g., a video).

Figure 1:
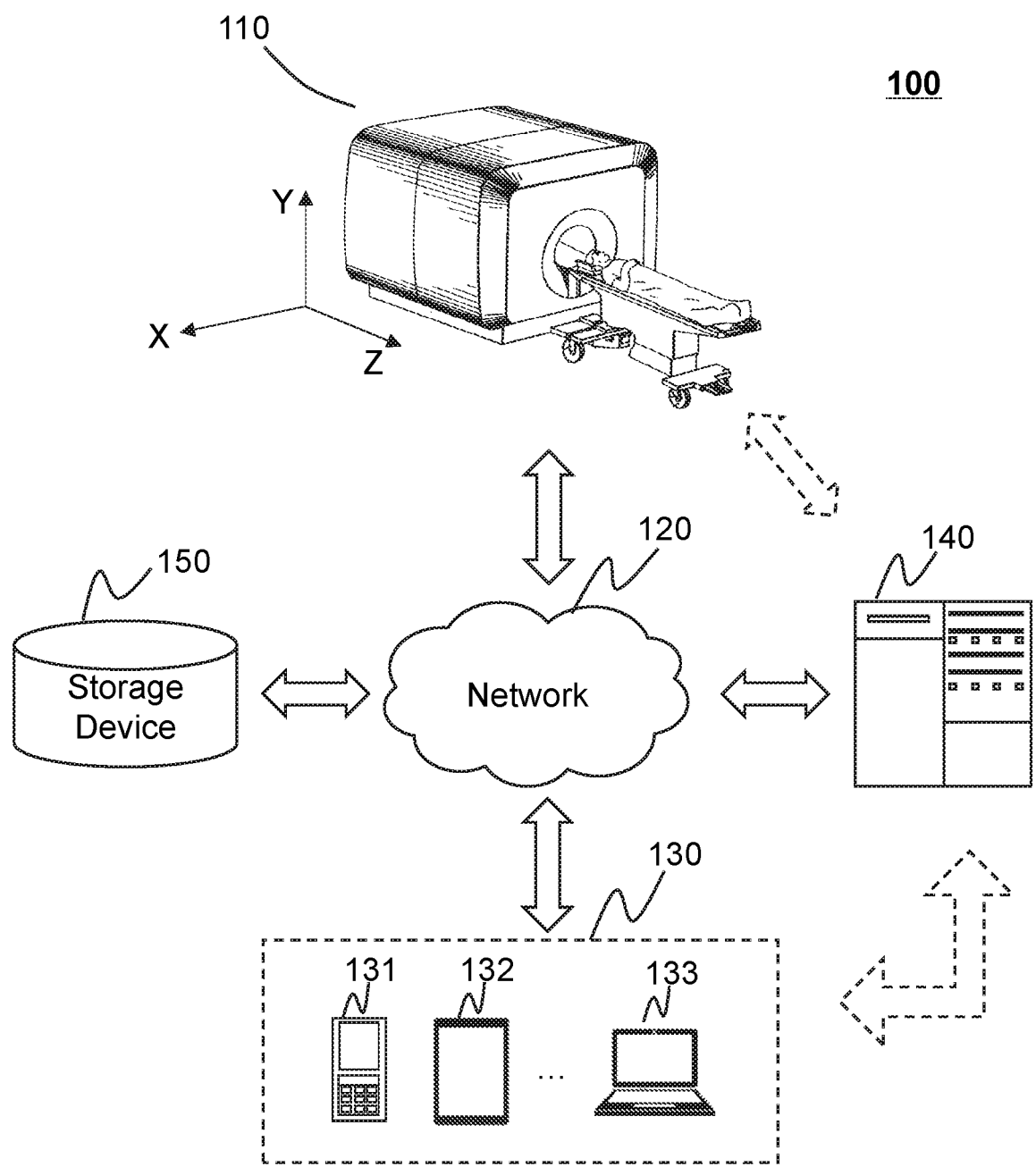
FIG. 1 is a schematic diagram illustrating an exemplary magnetic resonance imaging (MRI) system according to some embodiments of the present disclosure.

FIG. 1 is a schematic diagram illustrating an exemplary magnetic resonance imaging (MRI) system 100 according to some embodiments of the present disclosure. As illustrated, the MRI system 100 may include an MRI scanner 110, a network 120, a terminal 130, a processing device 140, and a storage device 150. The components of the MRI system 100 may be connected in one or more of various ways. Mere byway of example, as illustrated in FIG. 1, the MRI scanner 110 may be connected to the processing device 140 through the network 120. As another example, the MRI scanner 110 may be connected to the processing device 140 directly as indicated by the bi-directional arrow in dotted lines linking the MRI scanner 110 and the processing device 140. As a further example, the storage device 150 may be connected to the processing device 140 directly or through the network 120. As still a further example, a terminal device (e.g., 131, 132, 133, etc.) may be connected to the processing device 140 directly (as indicated by the bi-directional arrow in dotted lines linking the terminal 130 and the processing device 140) or through the network 120.

The MRI scanner 110 may scan a subject located within its detection space and generate a plurality of data (e.g., MR signals, a k-space dataset) relating to the subject. In the present disclosure, "subject" and "object" are used interchangeably. The subject may include a biological subject (e.g., a human, an animal), a non-biological subject (e.g., a phantom), etc. In some embodiments, the subject may include a specific part, organ, and/or tissue of the subject. For example, the subject may include head, brain, neck, body, shoulder, arm, thorax, cardiac, stomach, blood vessel, soft tissue, knee, feet, or the like, or any combination thereof. In some embodiments, the MRI scanner 110 may be a closed-bore scanner or an open-bore scanner.

In the present disclosure, the X axis, the Y axis, and the Z axis shown in FIG. 1 may form an orthogonal coordinate system. The X axis and the Z axis shown in FIG. 1 may be horizontal, and the Y axis may be vertical. As illustrated, the positive X direction along the X axis may be from the right side to the left side of the MRI scanner 110 seen from the direction facing the front of the MRI scanner 110; the positive Y direction along the Y axis shown in FIG. 1 may be from the lower part to the upper part of the MRI scanner 110; the positive Z direction along the Z axis shown in FIG. 1 may refer to a direction in which the subject is moved out of the scanning channel (or referred to as the bore) of the MRI scanner 110. More description of the MRI scanner 110 may be found elsewhere in the present disclosure. See, e.g., FIG. 2 and the description thereof.

The network 120 may include any suitable network that can facilitate the exchange of information and/or data for the MRI system 100. In some embodiments, one or more components of the MRI system 100 (e.g., the MRI scanner 110, the terminal 130, the processing device 140, or the storage device 150) may communicate information and/or data with one or more other components of the MRI system 100 via the network 120. For example, the processing device 140 may obtain a k-space dataset according to MR signals acquired by the MRI scanner 110 via the network 120. In some embodiments, the network 120 may be any type of wired or wireless network, or a combination thereof. The network 120 may be and/or include a public network (e.g., the Internet), a private network (e.g., a local area network (LAN), a wide area network (WAN)), etc.), a wired network (e.g., an Ethernet network), a wireless network (e.g., an 802.11 network, a Wi-Fi network, etc.), a cellular network (e.g., a Long Term Evolution (LTE) network), a frame relay network, a virtual private network ("VPN"), a satellite network, a telephone network, routers, hubs, switches, server computers, and/or any combination thereof. Merely by way of example, the network 120 may include a cable network, a wireline network, a fiber-optic network, a telecommunications network, an intranet, a wireless local area network (WLAN), a metropolitan area network (MAN), a public telephone switched network (PSTN), a Bluetooth™ network, a ZigBee™ network, a near field communication (NFC) network, or the like, or any combination thereof. In some embodiments, the network 120 may include one or more network access points. For example, the network 120 may include wired and/or wireless network access points such as base stations and/or internet exchange points through which one or more components of the MRI system 100 may be connected to the network 120 to exchange data and/or information.

The terminal 130 may include a mobile device 131, a tablet computer 132, a laptop computer 133, or the like, or any combination thereof. In some embodiments, the mobile device 131 may include a smart home device, a wearable device, a smart mobile device, a virtual reality device, an augmented reality device, or the like, or any combination thereof. In some embodiments, the smart home device may include a smart lighting device, a control device of an intelligent electrical apparatus, a smart monitoring device, a smart television, a smart video camera, an interphone, or the like, or any combination thereof. In some embodiments, the wearable device may include a smart bracelet, smart footgear, a pair of smart glasses, a smart helmet, a smart watch, smart clothing, a smart backpack, a smart accessory, or the like, or any combination thereof. In some embodiments, the smart mobile device may include a smartphone, a personal digital assistant (PDA), a gaming device, a navigation device, a point of sale (POS) device, or the like, or any combination thereof. In some embodiments, the virtual reality device and/or the augmented reality device may include a virtual reality helmet, a virtual reality glass, a virtual reality patch, an augmented reality helmet, an augmented reality glass, an augmented reality patch, or the like, or any combination thereof. For example, the virtual reality device and/or the augmented reality device may include a Google™ Glass, an Oculus Rift, a Hololens, a Gear VR, etc. In some embodiments, the terminal 130 may remotely operate the MRI scanner 110 and/or the processing device 140. In some embodiments, the terminal 130 may operate the MRI scanner 110 and/or the processing device 140 via a wireless connection. In some embodiments, the terminal 130 may receive information and/or instructions inputted by a user, and send the received information and/or instructions to the MRI scanner 110 or to the processing device 140 via the network 120. In some embodiments, the terminal 130 may receive data and/or information from the processing device 140. In some embodiments, the terminal 130 may be part of the processing device 140. In some embodiments, the terminal 130 may be omitted.

The processing device 140 may process data and/or information obtained from the MRI scanner 110, the terminal 130, and/or the storage device 150. For example, the processing device 140 may obtain a k-space dataset according to MR signals acquired by the MRI scanner 110. As another example, the processing device 140 may generate a reconstructed image based on a k-space dataset using an image reconstruction model. The image reconstruction model may include a sequence sub-model and a domain translation sub-model. In some embodiments, the processing device 140 may be a single server or a server group. The server group may be centralized, or distributed. In some embodiments, the processing device 140 may be local or remote. For example, the processing device 140 may access information and/or data stored in or acquired by the MRI scanner 110, the terminal 130, and/or the storage device 150 via the network 120. As another example, the processing device 140 may be directly connected to the MRI scanner 110 (as illustrated by the bidirectional arrow in dashed lines connecting the processing device 140 and the MRI scanner 110 in FIG. 1), the terminal 130 (as illustrated by the bidirectional arrow in dashed lines connecting the processing device 140 and the terminal 130 in FIG. 1), and/or the storage device 150 to access stored or acquired information and/or data. In some embodiments, the processing device 140 may be implemented on a cloud platform. Merely by way of example, the cloud platform may include a private cloud, a public cloud, a hybrid cloud, a community cloud, a distributed cloud, an inter-cloud, a multi-cloud, or the like, or any combination thereof.

The storage device 150 may store data and/or instructions. In some embodiments, the storage device 150 may store data obtained from the MRI scanner 110, the terminal 130 and/or the processing device 140. For example, the processing device 140 may generate a reconstructed image based on a k-space dataset according to MR signals acquired by the MRI scanner 110 using an image reconstruction model, and then the reconstructed image may be stored in the storage device 150 for further use or processing. The image reconstruction model may include a sequence sub-model and a domain translation sub-model. In some embodiments, the storage device 150 may store data obtained from the terminal 130 and/or the processing device 140. In some embodiments, the storage device 150 may store data and/or instructions that the processing device 140 may execute or use to perform exemplary methods described in the present disclosure. In some embodiments, the storage device 150 may include a mass storage device, a removable storage device, a volatile read-and-write memory, a read-only memory (ROM), or the like, or any combination thereof. Exemplary mass storage may include a magnetic disk, an optical disk, a solid-state drive, etc. Exemplary removable storage may include a flash drive, a floppy disk, an optical disk, a memory card, a zip disk, a magnetic tape, etc. Exemplary volatile read-and-write memory may include a random access memory (RAM). Exemplary RAM may include a dynamic RAM (DRAM), a double date rate synchronous dynamic RAM (DDR SDRAM), a static RAM (SRAM), a thyristor RAM (T-RAM), and a zero-capacitor RAM (Z-RAM), etc. Exemplary ROM may include a mask ROM (MROM), a programmable ROM (PROM), an erasable programmable ROM (PEROM), an electrically erasable programmable ROM (EEPROM), a compact disk ROM (CD-ROM), and a digital versatile disk ROM, etc. In some embodiments, the storage device 150 may be implemented on a cloud platform. Merely by way of example, the cloud platform may include a private cloud, a public cloud, a hybrid cloud, a community cloud, a distributed cloud, an inter-cloud, a multi-cloud, or the like, or any combination thereof.

In some embodiments, the storage device 150 may be connected to the network 120 to communicate with one or more components of the MRI system 100 (e.g., the MRI scanner 110, the processing device 140, the terminal 130, etc.). One or more components of the MRI system 100 may access the data or instructions stored in the storage device 150 via the network 120. In some embodiments, the storage device 150 may be directly connected to or communicate with one or more components of the MRI system 100 (e.g., the MRI scanner 110, the processing device 140, the terminal 130, etc.). In some embodiments, the storage device 150 may be part of the processing device 140.

In some embodiments, the MRI system 100 may further include one or more power supplies (not shown in FIG. 1) connected to one or more components of the MRI system 100 (e.g., the MRI scanner 110, the processing device 140, the terminal 130, the storage device 150, etc.).

Figure 2:
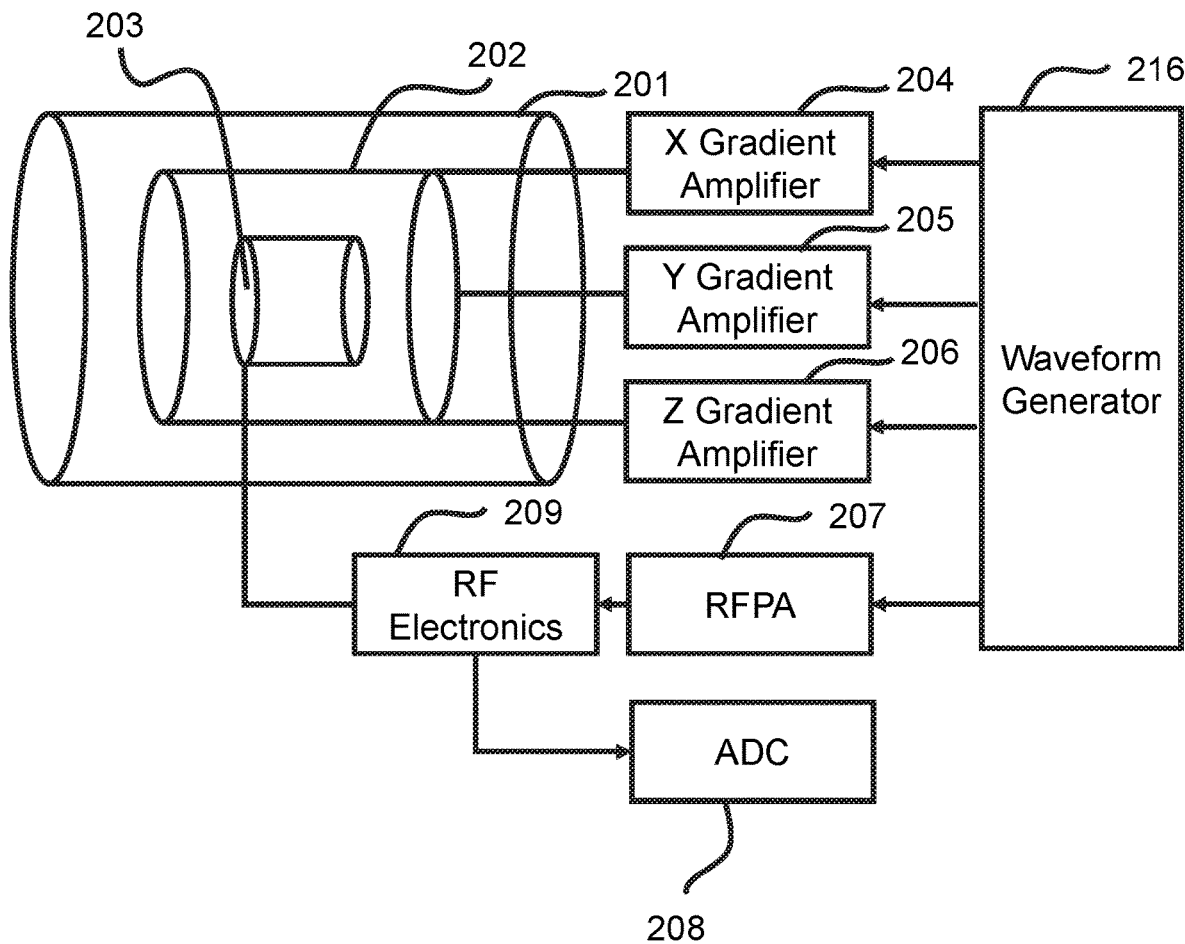
FIG. 2 is a schematic diagram illustrating an exemplary MRI scanner according to some embodiments of the present disclosure.

FIG. 2 is a schematic diagram illustrating an exemplary MRI scanner 110 according to some embodiments of the present disclosure. As illustrated, the main magnet 201 may generate a first magnetic field (or referred to as a main magnetic field) that may be applied to a subject (also referred to as an object) exposed inside the field. The main magnet 201 may include a resistive magnet or a superconductive magnet that both need a power supply (not shown) for operation. Alternatively, the main magnet 201 may include a permanent magnet. The main magnet 201 may include a bore that the subject is placed within. The main magnet 201 may also control the homogeneity of the generated main magnetic field. Some shim coils may be in the main magnet 201. The shim coils placed in the gap of the main magnet 201 may compensate for the inhomogeneity of the magnetic field of the main magnet 201. The shim coils may be energized by a shim power supply.

Gradient coils 202 may be located inside the main magnet 201. The gradient coils 202 may generate a second magnetic field (or referred to as a gradient field, including gradient fields Gx, Gy, and Gz). The second magnetic field may be superimposed on the main field generated by the main magnet 201 and distort the main field so that the magnetic orientations of the protons of a subject may vary as a function of their positions inside the gradient field, thereby encoding spatial information into MR signals generated by the region of the subject being imaged. The gradient coils 202 may include X coils (e.g., configured to generate the gradient field Gx corresponding to the X direction), Y coils (e.g., configured to generate the gradient field Gy corresponding to the Y direction), and/or Z coils (e.g., configured to generate the gradient field Gz corresponding to the Z direction) (not shown in FIG. 2). In some embodiments, the Z coils may be designed based on circular (Maxwell) coils, while the X coils and the Y coils may be designed on the basis of the saddle (Golay) coil configuration. The three sets of coils may generate three different magnetic fields that are used for position encoding. The gradient coils 202 may allow spatial encoding of MR signals for image reconstruction. The gradient coils 202 may be connected with one or more of an X gradient amplifier 204, a Y gradient amplifier 205, or a Z gradient amplifier 206. One or more of the three amplifiers may be connected to a waveform generator 216. The waveform generator 216 may generate gradient waveforms that are applied to the X gradient amplifier 204, the Y gradient amplifier 205, and/or the Z gradient amplifier 206. An amplifier may amplify a waveform. An amplified waveform may be applied to one of the coils in the gradient coils 202 to generate a magnetic field in the X-axis, the Y-axis, or the Z-axis, respectively. The gradient coils 202 may be designed for either a close-bore MRI scanner or an open-bore MRI scanner. In some instances, all three sets of coils of the gradient coils 202 may be energized and three gradient fields may be generated thereby. In some embodiments of the present disclosure, the X coils and Y coils may be energized to generate the gradient fields in the X direction and the Y direction. As used herein, the X-axis, the Y-axis, the Z-axis, the X direction, the Y direction, and the Z direction in the description of FIG. 2 are the same as or similar to those described in FIG. 1.

In some embodiments, radio frequency (RF) coils 203 may be located inside the main magnet 201 and serve as transmitters, receivers, or both. The RF coils 203 may be in connection with RF electronics 209 that may be configured or used as one or more integrated circuits (ICs) functioning as a waveform transmitter and/or a waveform receiver. The RF electronics 209 may be connected to a radiofrequency power amplifier (RFPA) 207 and an analog-to-digital converter (ADC) 208.

When used as transmitters, the RF coils 203 may generate RF signals that provide a third magnetic field that is utilized to generate MR signals related to the region of the subject being imaged. The third magnetic field may be perpendicular to the main magnetic field. The waveform generator 216 may generate an RF pulse. The RF pulse may be amplified by the RFPA 207, processed by the RF electronics 209, and applied to the RF coils 203 to generate the RF signals in response to a powerful current generated by the RF electronics 209 based on the amplified RF pulse.

When used as receivers, the RF coils may be responsible for detecting MR signals (e.g., echoes). After excitation, the MR signals generated by the subject may be sensed by the RF coils 203. The receive amplifier then may receive the sensed MR signals from the RF coils 203, amplify the sensed MR signals, and provide the amplified MR signals to the ADC 208. The ADC 208 may transform the MR signals from analog signals to digital signals. The digital MR signals then may be sent to the processing device 140 for sampling.

In some embodiments, the gradient coils 202 and the RF coils 203 may be circumferentially positioned with respect to the subject. It is understood by those skilled in the art that the main magnet 201, the gradient coils 202, and the RF coils 203 may be situated in a variety of configurations around the subject.

In some embodiments, the RFPA 207 may amplify an RF pulse (e.g., the power of the RF pulse, the voltage of the RF pulse) such that an amplified RF pulse is generated to drive the RF coils 203. The RFPA 207 may include a transistor-based RFPA, a vacuum tube-based RFPA, or the like, or any combination thereof.

The transistor-based RFPA may include one or more transistors. The vacuum tube-based RFPA may include a triode, a tetrode, a klystron, or the like, or any combination thereof. In some embodiments, the RFPA 207 may include a linear RFPA, or a nonlinear RFPA. In some embodiments, the RFPA 207 may include one or more RFPAs.

In some embodiments, the MRI scanner 110 may further include a subject positioning system (not shown). The subject positioning system may include a subject cradle and a transport device. The subject may be placed on the subject cradle and be positioned by the transport device within the bore of the main magnet 201.

FIG. 3 is a schematic diagram illustrating exemplary hardware and/or software components of a computing device on which the processing device 140 may be implemented according to some embodiments of the present disclosure. As illustrated in FIG. 3, the computing device 300 may include a processor 310, a storage 320, the input/output (I/O) 330, and a communication port 340.

The processor 310 may execute computer instructions (program code) and perform functions of the processing device 140 in accordance with techniques described herein. The computer instructions may include routines, programs, objects, components, signals, data structures, procedures, modules, and functions, which perform particular functions described herein. For example, the processor 310 may obtain, from the storage device 150 and/or the terminal 130, an image reconstruction model. The image reconstruction model may include a sequence sub-model and a domain translation sub-model. In some embodiments, the processor 310 may include a microcontroller, a microprocessor, a reduced instruction set computer (RISC), an application specific integrated circuits (ASICs), an application-specific instruction-set processor (ASIP), a central processing unit (CPU), a graphics processing unit (GPU), a physics processing unit (PPU), a microcontroller unit, a digital signal processor (DSP), a field programmable gate array (FPGA), an advanced RISC machine (ARM), a programmable logic device (PLD), any circuit or processor capable of executing one or more functions, or the like, or any combinations thereof.

Merely for illustration purposes, only one processor is described in the computing device 300. However, it should be noted that the computing device 300 in the present disclosure may also include multiple processors, and thus operations of a method that are performed by one processor as described in the present disclosure may also be jointly or separately performed by the multiple processors. For example, if in the present disclosure the processor of the computing device 300 executes both operations A and B, it should be understood that operations A and step B may also be performed by two different processors jointly or separately in the computing device 300 (e.g., a first processor executes operation A and a second processor executes operation B, or the first and second processors jointly execute operations A and B).

Merely byway example, the processor 310 may receive instructions to follow an MRI scan protocol for imaging/scanning the subject. For example, the processor 310 may instruct the subject positioning system of the MRI scanner 110 to move the subject to a proper position within the bore of the main magnet 201. As another example, the processor 310 may also provide certain control signals to control the main magnet 201 to generate a main magnet field with a specific strength.

The processor 310 may receive control signals to set the shape, amplitude, and/or timing of the gradient waveforms and/or the RF waveforms, and send the set parameters to the waveform generator 216 to instruct the waveform generator 216 to generate a particular gradient waveform sequence and pulse sequence that are to be applied to the gradient coils 202 and the RF coils 203 through the amplifiers 204-207, respectively.

The processor 310 may also sample data (e.g., echoes) from the RF coils 203 based on one or more sampling parameters including, e.g., timing information (e.g., the length of data acquisition), the type of k-space data acquisition (e.g., sub-sampling, oversampling, etc.), sampling trajectory (e.g., Cartesian trajectory, non-Cartesian trajectory such as spiral trajectory, radial trajectory), or the like, or a combination thereof. In some embodiments, the timing information may be input by a user (e.g., an operator) or autonomously determined by the MRI system 100 based on one or more other parameters (e.g., clinical needs) of an imaging process. The timing information may correspond to the type of the gradient and RF waveforms that are sent to the gradient coils 202 and the RF coils 203, respectively, so that the MR signals are correctly sampled. The processor 310 may also generate an MR image by reconstructing the sampled data.

The storage 320 may store data/information obtained from the MRI scanner 110, the terminal 130, the storage device 150, or any other component of the MRI system 100. In some embodiments, the storage 320 may include amass storage device, a removable storage device, a volatile read-and-write memory, a read-only memory (ROM), or the like, or any combination thereof. For example, the mass storage device may include a magnetic disk, an optical disk, a solid-state drive, etc. The removable storage device may include a flash drive, a floppy disk, an optical disk, a memory card, a zip disk, a magnetic tape, etc. The volatile read-and-write memory may include a random access memory (RAM). The RAM may include a dynamic RAM (DRAM), a double date rate synchronous dynamic RAM (DDR SDRAM), a static RAM (SRAM), a thyristor RAM (T-RAM), and a zero-capacitor RAM (Z-RAM), etc. The ROM may include a mask ROM (MROM), a programmable ROM (PROM), an erasable programmable ROM (PEROM), an electrically erasable programmable ROM (EEPROM), a compact disk ROM (CD-ROM), and a digital versatile disk ROM, etc. In some embodiments, the storage 320 may store one or more programs and/or instructions to perform exemplary methods described in the present disclosure. For example, the storage 320 may store a program for the processing device 140 for generating a reconstructed image based on a k-space dataset using an image reconstruction model. The image reconstruction model may include a sequence sub-model and a domain translation sub-model.

The I/O 330 may input or output signals, data, or information. In some embodiments, the I/O 330 may enable user interaction with the processing device 140. In some embodiments, the I/O 330 may include the input device and an output device. Exemplary input devices may include a keyboard, a mouse, a touch screen, a microphone, a trackball, or the like, or a combination thereof. Exemplary output devices may include a display device, a loudspeaker, a printer, a projector, or the like, or a combination thereof. Exemplary display devices may include a liquid crystal display (LCD), a light-emitting diode (LED)-based display, a flat panel display, a curved screen, a television device, a cathode ray tube (CRT), or the like, or a combination thereof.

Merely by way of example, a user (e.g., an operator) of the processing device 140 may input data related to a subject (e.g., a patient) that is being/to be imaged/scanned through the I/O 330. The data related to the subject may include identification information (e.g., the name, age, gender, medical history, contract information, physical examination result, etc.) and/or the test information including the nature of the MRI scan that must be performed. The user may also input parameters needed for the operation of the MRI scanner 110, such as image contrast and/or ratio, a region of interest (ROI), slice thickness, an imaging type (e.g., T1 weighted imaging, T2 weighted imaging, proton density weighted imaging, etc.), T1, T2, an echo type (spin echo, fast spin echo (FSE), fast recovery FSE, single shot FSE, gradient recalled echo, fast imaging with steady-state procession, and so on), a flip angle value, acquisition time (TA), echo time (TE), repetition time (TR), echo train length (ETL), the number of phases, the number of excitations (NEX), inversion time, bandwidth (e.g., RF receiver bandwidth, RF transmitter bandwidth, etc.), a scan type, a type of sampling, or the like, or any combination thereof. The I/O may also display MR images (e.g., videos) generated based on the sampled data.

The communication port 340 may be connected to a network (e.g., the network 120) to facilitate data communications. The communication port 340 may establish connections between the processing device 140 and the MRI scanner 110, the terminal 130, or the storage device 150. The connection may be a wired connection, a wireless connection, or a combination of both that enables data transmission and reception. The wired connection may include an electrical cable, an optical cable, a telephone wire, or the like, or any combination thereof. The wireless connection may include Bluetooth, Wi-Fi, WiMax, WLAN, ZigBee, mobile network (e.g., 3G, 4G, 5G, etc.), or the like, or a combination thereof. In some embodiments, the communication port 340 may be a standardized communication port, such as RS232, RS485, etc. In some embodiments, the communication port 340 may be a specially designed communication port. For example, the communication port 340 may be designed in accordance with the digital imaging and communications in medicine (DICOM) protocol.

Figure 4:
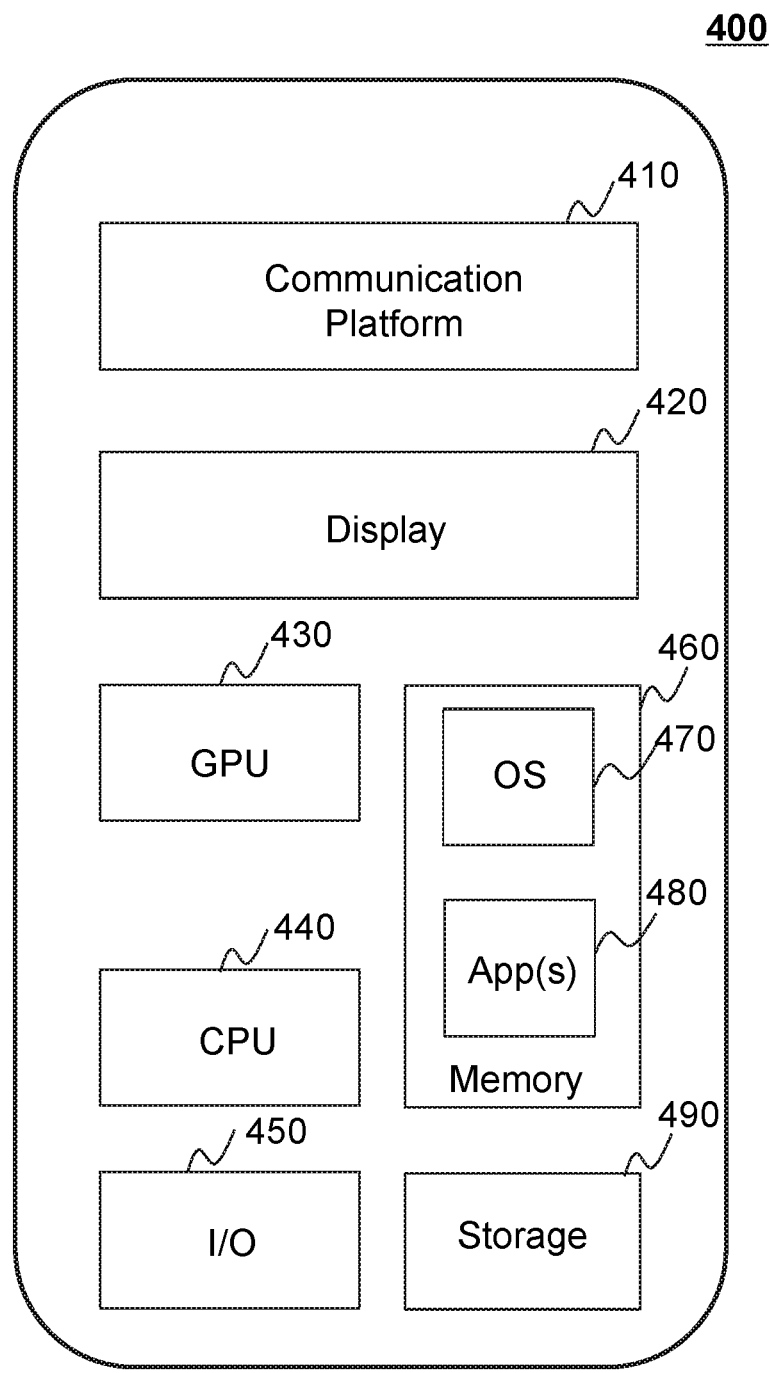
FIG. 4 is a schematic diagram illustrating exemplary hardware and/or software components of a mobile device according to some embodiments of the present disclosure.

FIG. 4 is a schematic diagram illustrating exemplary hardware and/or software components of a mobile device on which the terminal 130 may be implemented according to some embodiments of the present disclosure. As illustrated in FIG. 4, the mobile device 400 may include a communication platform 410, a display 420, a graphic processing unit (GPU) 430, a central processing unit (CPU) 440, an I/O 450, a memory 460, and a storage 490. In some embodiments, any other suitable component, including but not limited to a system bus or a controller (not shown), may also be included in the mobile device 400. In some embodiments, a mobile operating system 470 (e.g., iOS, Android, Windows Phone, etc.) and one or more applications 480 may be loaded into the memory 460 from the storage 490 in order to be executed by the CPU 440. The applications 480 may include a browser or any other suitable mobile apps for receiving and rendering information relating to image processing or other information from the processing device 140. User interactions with the information stream may be achieved via the I/O 450 and provided to the processing device 140 and/or other components of the MRI system 100 via the network 120.

To implement various modules, units, and their functionalities described in the present disclosure, computer hardware platforms may be used as the hardware platform(s) for one or more of the elements described herein. The hardware elements, operating systems and programming languages of such computers are conventional in nature, and it is presumed that those skilled in the art are adequately familiar therewith to adapt those technologies to the blood pressure monitoring as described herein. A computer with user interface elements may be used to implement a personal computer (PC) or another type of work station or terminal device, although a computer may also act as a server if appropriately programmed. It is believed that those skilled in the art are familiar with the structure, programming and general operation of such computer equipment and as a result the drawings should be self-explanatory.

Figure 5:
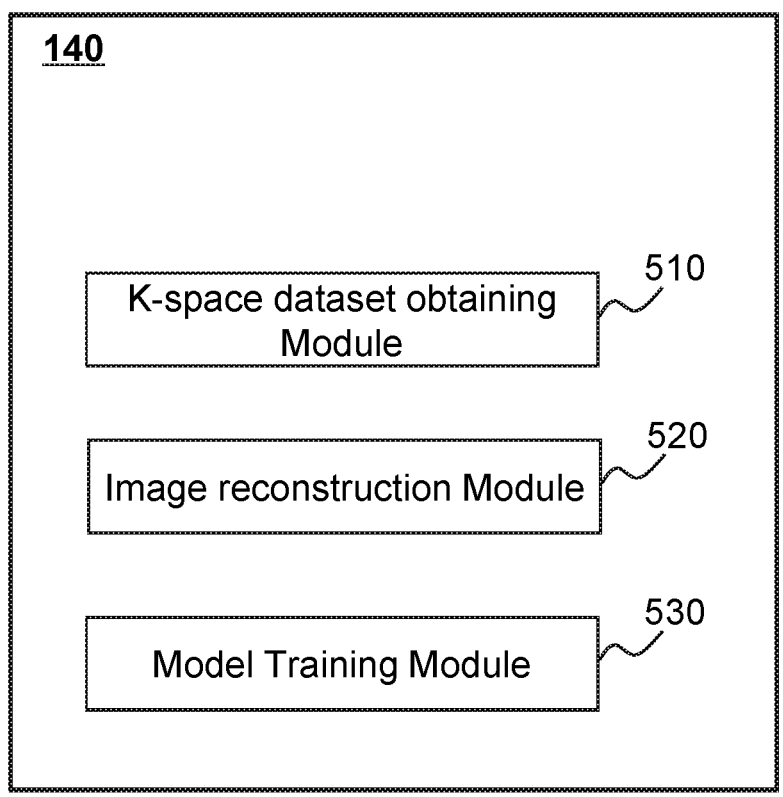
FIG. 5 is a schematic block diagram illustrating an exemplary processing device according to some embodiments of the present disclosure.

FIG. 5 is a schematic block diagram illustrating an exemplary processing device 140 according to some embodiments of the present disclosure. The processing device 140 may include a k-space dataset obtaining module 510, an image reconstruction module 520, and a model training module 530.

The k-space dataset obtaining module 510 may be configured to obtain a k-space dataset according to MR signals acquired by an MRI scanner (e.g., the MRI scanner 110). As illustrated in FIG. 1, the MRI scanner may acquire the MR signals by scanning a subject (e.g., organ, tissue). In some embodiments, the MRI scanner may acquire the MR signals in real-time. In some embodiments, the MRI scanner may acquire the MR signals in advance. The k-space dataset obtaining module 510 may obtain the MR signals from the MRI scanner or a storage device where the MR signals are stored.

In some embodiments, the k-space dataset obtaining module 510 may generate the k-space dataset by filling a k-space using the MR signals. In some embodiments, the k-space dataset obtaining module 510 may fill the k-space based on a sampling technique. In some embodiments, the k-space dataset obtaining module 510 may generate the k-space dataset by filling at least a part of data points in the k-space dataset using the MR signals. In some embodiments, the k-space dataset may include a k-space dataset that is fully sampled, a sub-sampled k-space dataset, etc. The k-space dataset obtaining module 510 may obtain the k-space dataset from a storage device where the k-space dataset is stored.

In some embodiments, the k-space dataset obtaining module 510 may obtain the sub-sampled k-space dataset based on a sub-sampling pattern or trajectory. In some embodiments, sampled points distributed on the sub-sampling pattern or trajectory may match the brightness distribution of the data points in the k-space. Usually, the brightness of data points in a center region of the k-space may be greater than an edge region of the k-space region of the k-space. Accordingly, the sampling density at a center region of the k-space may be greater than that at an edge region of the k-space. As used herein, the sampling density of the k-space may refer to a count of sampled points per unit area of the k-space or a part of the k-space. Additionally or alternatively, the center region of the k-space may be fully sampled, and the remaining region of the k-space may be sub-sampled.

In some embodiments, the k-space dataset obtaining module 510 may generate the sub-sampling pattern or trajectory based on a sampling mask. For illustration purposes, the sampling mask may include a binary matrix, where "1" means that a data point in the k-space is sampled, and "0" means that a data point in k-space is not sampled. In some embodiments, the sampling pattern or trajectory may be specified for the MRI system 100 (e.g., the MRI scanner 110) based on the type thereof. Accordingly, the k-space dataset obtaining module 510 may select the sampling mask based on the type of the MRI system 100. For example, if a sub-sampling pattern or trajectory determined by a Cartesian sampling mask is suitable (e.g., providing better quality of a reconstructed image) for the type of the MRI system 100, the sampling mask may include the Cartesian sampling mask.

The image reconstruction module 520 may be configured to generate a reconstructed image based on the k-space dataset using an image reconstruction model. The image reconstruction model may include a sequence sub-model and a domain translation sub-model. As used herein, the sequence sub-model may be configured to determine a feature representation of the k-space dataset. For example, the feature representation may include a low-level feature (e.g., an edge feature (a general shape or contour), a texture feature) in a k-space domain corresponding to the k-space dataset, a high-level feature (e.g., a semantic feature) in the k-space domain, a complicated feature (e.g., a deep hierarchical feature) in the k-space domain, etc. In some embodiments, the image reconstruction module 520 may input at least a part of the k-space dataset into the sequence sub-model. Further, the image reconstruction module 520 may output the feature representation of the k-space dataset from the sequence sub-model. In some embodiments, the k-space dataset may include a plurality of data points. The image reconstruction module 520 may remove unsampled data points (e.g., the data points assigned with zero) based on sub-sampling information of the k-space dataset, and then input thereof into the sequence sub-model. In some embodiments, the image reconstruction module 520 may also obtain additional information of the plurality of data points (or the remaining data points after a portion of the data points, e.g., the unsampled data points, are removed). For example, the additional information (e.g., characteristic information) may include sub-sampling information of the plurality of data points (or the remaining data points), location information of the plurality of data points (or the remaining data points), timing information of the plurality of data points (or the remaining data points), etc. In some embodiments, the image reconstruction module 520 may concatenate the additional information of the plurality of data points (or the remaining data points) and the plurality of data points (or the remaining data points), and then input thereof into the sequence sub-model. For example, the image reconstruction module 520 may obtain a tensor by concatenating the plurality of data points (or the remaining data points) and the additional information of the plurality of data points (or the remaining data points), and input at least a part of the tensor into the sequence sub-sub-model. As used herein, a tensor may refer to an algebraic object that describes a linear mapping from one set of algebraic objects (e.g., vectors, scalars) to another. For example, the tensor may include a multi-dimensional array of numerical values.

In some embodiments, the image reconstruction module 520 may obtain a series of data points based on the k-space dataset. The image reconstruction module 520 may sequentially input at least a part of the series of data points into the sequence sub-model. For instance, the image reconstruction module 520 may obtain the series of data points in the form of a vector, matrix, or tensor, and sequentially input at least a part of the series of data points into the sequence sub-model. Further, the image reconstruction module 520 may output the feature representation of the k-space dataset from the sequence sub-model.

As used herein, the vector, matrix, or tensor may include the series of data points or a part thereof. In some embodiments, the image reconstruction module 520 may obtain the vector, matrix, or tensor based on the k-space dataset (i.e., the plurality of data points). In some embodiments, each of the series of data points may correspond to a data point in the k-space dataset. The image reconstruction module 520 may reshape the k-space dataset (i.e., the plurality of data points) to the vector, matrix, or tensor.

In some embodiments, the image reconstruction module 520 may obtain additional information of the series of data points. As used herein, additional information of a data point in the series of data points may include information of a corresponding data point in the k-space dataset. For example, the additional information may include sub-sampling information of the series of data points, location information of the series of data points, timing information of the series of data points, etc. In some embodiments, the image reconstruction module 520 may obtain at least one series of data points with respect to at least a part of the additional information of the series of data points. The image reconstruction module 520 may concatenate the at least one series of data points and the series of data points and input thereof into the sequence sub-model. In some embodiments, the image reconstruction module 520 may obtain the at least one series of data points in the form of at least one vector, matrix, or tensor. The image reconstruction module 520 may concatenate the at least one vector (matrix or tensor) and the vector (matrix or tensor), and input thereof into the sequence sub-model.

In some embodiments, the image reconstruction module 520 may obtain the vector (the matrix or tensor) and/or the vector(s) (the matrix(es) or tensor(s)) with respect to the additional information according to a sequence or rule. For example, if the plurality of data points in the k-space data is arranged in a matrix, the image reconstruction module 520 may obtain the vector by retrieving and/or reshaping the plurality of data points by row or by column according to the sequence or rule. Accordingly, the image reconstruction module 520 may obtain the vector(s) with respect to the additional information by retrieving and/or reshaping the additional information of the plurality of data points by row or by column. As another example, the image reconstruction module 520 may obtain the matrix(es) to be input to the sequence sub-model with respect to the additional information by retrieving and/or reshaping the plurality of data points according to the dimension of a matrix. As a further example, each of the tensor(s) to be input to the sequence sub-model may have a specified dimension (e.g., 3, 5). The image reconstruction module 520 may obtain the tensor(s) to be input to the sequence sub-model with respect to the additional information by retrieving and/or reshaping the plurality of data points according to the specified dimension. In some embodiments, if the vector includes the location information of the series of data points, the image reconstruction module 520 may obtain the vector by retrieving and/or reshaping the plurality of data points randomly. Accordingly, the processing device 140 may obtain the vector(s) with respect to the additional information by retrieving and/or reshaping the additional information of the plurality of data points randomly.

In some embodiments, the image reconstruction module 520 may sequentially input at least a part of the series of data points (e.g., the vector, matrix, or tensor) into the sequence sub-model. In some embodiments, the image reconstruction module 520 may sequentially input the series of data points (e.g., in the form of a vector, matrix, or tensor) into the sequence sub-model. In some embodiments, the input of the sequence sub-model may include, besides the at least a part of the series of data points (e.g., in the form of a vector, matrix, or tensor), additional information of these data points (e.g., the sub-sampling information, the location information, the timing information, or the like, or a combination thereof). For example, the image reconstruction module 520 may obtain one or more concatenated vectors, matrices, or tensors by combining the series of the data points and the additional information of the series of data points, and retrieve, from the one or more concatenated vectors, matrices, or tensors, input to the sequence sub-model. Before inputting the series of data points (e.g., the vector (matrix or tensor), or the concatenated vector(s), (matrix(es) or tensor(s)) into the sequence sub-model, the image reconstruction module 520 may remove data points of the series of data points (e.g., the vector, matrix, or tensor), or the concatenated vector(s), matrix(es), or tensor(s)) corresponding to the unsampled data points (e.g., the data points assigned with zero) in the k-space dataset from the series of data points based on the sub-sampling information. For illustration purposes, the vector (or matrix or tensor) may include only data points corresponding to the sampled data points in the k-space. The concatenated vector(s) (or matrix(es) or tensor(s)) may include the data points corresponding to the sampled data points in the k-space and additional information thereof.

The domain translation sub-model may be configured to determine the reconstructed image based on the feature representation of the k-space dataset. In some embodiments, the image reconstruction module 520 may input the feature representation into the domain translation sub-model. The domain translation sub-model may then output the reconstructed image.

In some embodiments, the image reconstruction module 520 may obtain the sequence sub-model and the domain translation sub-model from a storage device (e.g., the storage device 150, the storage 320, the storage 490) disclosed elsewhere in the present disclosure or a third party (e.g., an external device).

The model training module 530 may be configured to generate the image reconstruction model. In some embodiments, the processing device 140 may generate the image reconstruction model by training a preliminary image reconstruction model based on at least one of a plurality of training k-space datasets.

In some embodiments, the model training module 530 may obtain the plurality of training k-space datasets. In some embodiments, the plurality of training k-space datasets may include one or more sub-sampled training k-space datasets, one or more training k-space datasets that are fully sampled, etc. A first part of the sub-sampled training k-space datasets may be directly acquired by an MRI scanner (e.g., the MRI scanner 110), a storage device (e.g., the storage device 150, the storage 320, the storage 490), an external device, etc. In some embodiments, the model training module 530 may obtain one or more reference k-space datasets that are fully sampled. The model training module 530 may obtain a second part of the sub-sampled training k-space datasets by sub-sampling the one or more reference k-space datasets.

In some embodiments, the model training module 530 may remove unsampled training data points (e.g., the training data points assigned with zero) based on training sub-sampling information of a plurality of training data points of each training k-space dataset, and generate the image reconstruction model based on thereof. In some embodiments, the model training module 530 may obtain additional training information of the plurality of training data points (or the remaining training data points after a portion of the training data points, e.g., the unsampled training data points, are removed) in each training k-space dataset. In some embodiments, the model training module 530 may generate the image reconstruction model based on the plurality of training data points (or the remaining training data points) and the additional training information thereof. For example, the additional training information may include training sub-sampling information of the plurality of training data points (or the remaining training data points), training location information of the plurality of training data points (or the remaining training data points), training timing information of the plurality of training data points (or the remaining training data points), etc.

In some embodiments, the model training module 530 may obtain a series of training data points corresponding to each training k-space dataset. The model training module 530 may obtain the series of training data points based on a process similar to the process for obtaining the series of data points as illustrated above. In some embodiments, the model training module 530 may generate the image reconstruction model based on the series of training data points. In some embodiments, the model training module 530 may also obtain additional training information of the series of training data points. The model training module 530 may generate the image reconstruction model based on the series of training data points and the additional training information of the series of training data points. As used herein, additional training information of a training data point in the series of training data points may include additional training information of a corresponding training data point in the training k-space dataset. For example, the additional training information may include training sub-sampling information of the series of training data points, training location information of the series of training data points, training timing information of the series of training data points, etc.

In some embodiments, the model training module 530 may generate the image reconstruction model by performing a plurality of iterations to iteratively update one or more parameters of the preliminary image reconstruction model or an updated image reconstruction model. For example, the parameters may include the size of a kernel of a layer, the total count (or number) of layers, a count (or number) of nodes in a layer, a learning rate, a batch size, an epoch, a connected weight between two connected nodes, a bias vector relating to a node, an activation vector of a node in a layer, etc. In some embodiments, the model training module 530 may generate the image reconstruction model based on a training algorithm. For example, the training algorithm may include a gradient descent algorithm, Newton's algorithm, a Quasi-Newton algorithm, a Levenberg-Marquardt algorithm, a conjugate gradient algorithm, or the like, or any combination thereof.

The modules in the processing device 140 may be connected to or communicate with each other via a wired connection or a wireless connection. The wired connection may include a metal cable, an optical cable, a hybrid cable, or the like, or any combination thereof. The wireless connection may include a Local Area Network (LAN), a Wide Area Network (WAN), a Bluetooth, a ZigBee, a Near Field Communication (NFC), or the like, or any combination thereof. Two or more of the modules may be combined as a single module, and any one of the modules may be divided into two or more units.

It should be noted that the above description is merely provided for the purposes of illustration, and not intended to limit the scope of the present disclosure. For persons having ordinary skills in the art, multiple variations and modifications may be made under the teachings of the present disclosure. However, those variations and modifications do not depart from the scope of the present disclosure. For example, the processing device 140 may further include a storage module (not shown in FIG. 5). The storage module may be configured to store data generated during any process performed by any component of the processing device 140. As another example, each of the components of the processing device 140 may include a storage device. Additionally or alternatively, the components of the processing device 140 may share a common storage device. As a further example, the model training module 530 may be unnecessary and the image reconstruction model may be obtained from a storage device (e.g., the storage device 150, the storage 320, the storage 490) disclosed elsewhere in the present disclosure.

Figure 6:
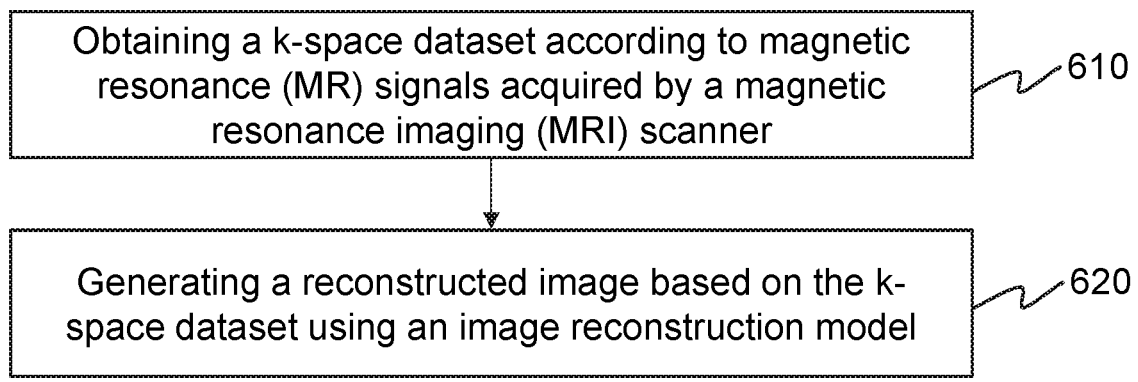
FIG. 6 is a flowchart illustrating an exemplary process for generating a reconstructed image based on a k-space dataset using an image reconstruction model according to some embodiments of the present disclosure.

FIG. 6 is a flowchart illustrating an exemplary process for generating a reconstructed image based on a k-space dataset using an image reconstruction model according to some embodiments of the present disclosure. In some embodiments, the process 600 may be implemented in the MRI system 100 illustrated in FIG. 1. For example, the process 600 may be stored in a storage medium (e.g., the storage device 150, or the storage 320 of the processing device 140) as a form of instructions, and can be invoked and/or executed by the processing device 140 (e.g., the processor 310 of the processing device 140, or one or more modules in the processing device 140 illustrated in FIG. 5). The operations of the illustrated process 600 presented below are intended to be illustrative. In some embodiments, the process 600 may be accomplished with one or more additional operations not described, and/or without one or more of the operations discussed. Additionally, the order in which the operations of the process 600 as illustrated in FIG. 6 and described below is not intended to be limiting.

In 610, the processing device 140 (e.g., the k-space dataset obtaining module 510) may obtain a k-space dataset according to MR signals acquired by an MRI scanner (e.g., the MRI scanner 110). As illustrated in FIG. 1, the MRI scanner may acquire the MR signals by scanning a subject or a part thereof (e.g., organ, tissue). In some embodiments, the MRI scanner may acquire the MR signals in real-time. In some embodiments, the MRI scanner may acquire the MR signals in advance. The processing device 140 may obtain the MR signals from the MRI scanner or a storage device where the MR signals are stored.

In some embodiments, the processing device 140 may generate the k-space dataset by filling a k-space using the MR signals. In some embodiments, the processing device 140 may fill the k-space based on a sampling technique. For example, the sampling technique may include a Cartesian sampling technique, a spiral sampling technique, a radial sampling technique, a Z-sampling technique, etc. The processing device 140 may obtain the k-space dataset from a storage device where the k-space dataset is stored.

In some embodiments, the processing device 140 may further use the k-space dataset to generate a reconstructed image. The k-space dataset may include a plurality of data points representing spatial frequencies of pixels in the reconstructed image. Each data point in the k-space dataset may contain information of a spatial frequency about every pixel in the reconstructed image. The brightness of each data point in the k-space dataset may represent a relative contribution of the data point's unique spatial frequency to the reconstructed image. In some embodiments, each data point in the k-space dataset may be represented as a complex value. The data point may include a magnitude component and a phase component. For illustration purposes, the k-space dataset may include a two-dimensional (2D) k-space dataset, a three-dimensional (3D) k-space dataset, a four-dimensional (4D) k-space dataset, etc. Accordingly, the reconstructed image may include a 2D image, a 3D image, a 4D image (e.g., a video), etc.

In some embodiments, the processing device 140 may generate the k-space dataset by filling at least a part of the plurality of data points using the MR signals. In some embodiments, the k-space dataset may include a k-space dataset that is fully sampled, i.e., the plurality of data points of the k-space dataset may be obtained by sampling the MR signals. In some embodiments, the k-space dataset may include a sub-sampled k-space dataset, i.e., only a part of the plurality of data points of the k-space dataset may be obtained by sampling the MR signals, while the remaining part of the plurality of data points of the k-space dataset may be obtained by assigning one or more values not sampled from the MR signals. For illustration purposes, the processing device 140 may assign the unsampled data points with one or more initial values, e.g., zero.

In some embodiments, the processing device 140 may obtain the sub-sampled k-space dataset based on a sub-sampling pattern or trajectory. In some embodiments, sampled points distributed on the sub-sampling pattern or trajectory may match the brightness distribution of the data points in the k-space. Usually, the brightness of data points in a center region of the k-space may be greater than in an edge region of the k-space region of the k-space. Accordingly, the sampling density at a center region of the k-space may be greater than at an edge region of the k-space. As used herein, the sampling density of the k-space may refer to a count of sampled points per unit area of the k-space or a part of the k-space. Additionally or alternatively, the center region of the k-space may be fully sampled, and the remaining region of the k-space may be sub-sampled.

In some embodiments, the processing device 140 may obtain the sub-sampling pattern or trajectory based on a sampling mask. For illustration purposes, the sampling mask may include a binary matrix, where "1" means that a data point in the k-space is sampled, and "0" means that a data point in the k-space is not sampled. In some embodiments, the sampling mask may have a sampling rate. As used herein, the sampling rate of a sampling mask may refer to a ratio of sampled points to all points in the sampling mask. The sampling rate may be default settings in the MRI scanner, or set by the MRI system 100 or a user.

For example, the sampling mask may include a 2D random sampling mask, a pseudo-radial sampling mask, a Cartesian sampling mask, etc. In some embodiments, the sampling pattern or trajectory may be specified for the MRI system 100 (e.g., the MRI scanner 110) based on the type thereof. Accordingly, the processing device 140 may select the sampling mask based on the type of the MRI system 100. For example, if a sub-sampling pattern or trajectory according to a Cartesian sampling mask is suitable (e.g., providing better quality of a reconstructed image) for the type of the MRI system 100, the sampling mask may include the Cartesian sampling mask.

In 620, the processing device 140 (e.g., the image reconstruction module 520) may generate a reconstructed image based on the k-space dataset using an image reconstruction model. For example, the image reconstruction model may include a simple recurrent network (SRN) model, a gated sequence model (e.g., an LSTM network model), a stacked recurrent neural network (SRNN) model, a bi-directional recurrent network model, a recursive neural network (RecNN) model, a graph network model, a convolutional neural network (CNN) model, a transformer (e.g., a transformer XL, a bidirectional encoder representation from transformer (BERT)), a fully convolutional neural network (FCN) model, a generative adversarial network (GAN) model, a back propagation (BP) neural network model, a radial basis function (RBF) neural network model, a deep belief nets (DBN) neural network model, an Elman neural network model, or the like, or any combination thereof. In some embodiments, the image reconstruction model may include a sequence sub-model and a domain translation sub-model. For example, the sequence sub-model may include a simple recurrent unit (SRU), a gated unit, a long-short-term memory (LSTM) unit, an attention layer, a bi-direction recurrent unit, or the like, or any combination thereof. As another example, the sequence sub-model may include a simple recurrent network (SRN) model, a gated sequence model (e.g., an LSTM network model), a stacked recurrent neural network (SRNN) model, a bi-directional recurrent network model, a recursive neural network (RecNN) model, a graph network model, a convolutional neural network (CNN) model, a transformer (e.g., a transformer XL, a bidirectional encoder representation from transformer (BERT)), etc. For illustration purposes, the CNN model may include a one-dimensional CNN model, a multi-dimensional CNN model, etc. For instance, one dimension of a multi-dimensional CNN model may be used to indicate or record a sequence of the data to be treated with the sequence sub-model. As used herein, the sequence sub-model may be configured to determine a feature representation of the k-space dataset. For example, the feature representation may include a low-level feature (e.g., an edge feature, a texture feature) in a k-space domain corresponding to the k-space dataset, a high-level feature (e.g., a semantic feature) in the k-space domain, a complicated feature (e.g., a deep hierarchical feature) in the k-space domain, etc.

In some embodiments, the processing device 140 may input at least a part of the k-space dataset into the sequence sub-model (e.g., a CNN model). Further, the processing device 140 may output the feature representation of the k-space dataset from the sequence sub-model. In some embodiments, the processing device 140 may remove unsampled data points (e.g., the data points assigned with zero) based on sub-sampling information of the k-space dataset, and then input thereof into the sequence sub-model. In some embodiments, the processing device 140 may also obtain additional information of the plurality of data points (or the remaining data points after a portion of the data points, e.g., the unsampled data points, are removed). For example, the additional information may include sub-sampling information of the plurality of data points (or the remaining data points), location information of the plurality of data points (or the remaining data points), timing information of the plurality of data points (or the remaining data points), etc. In some embodiments, the processing device 140 may concatenate the additional information of the plurality of data points (or the remaining data points) and the plurality of data points (or the remaining data points), and then input thereof into the sequence sub-model. For example, the processing device 140 may obtain a tensor by concatenating the plurality of data points (or the remaining data points) and the additional information of the plurality of data points (or the remaining data points), and input at least a part of the tensor into the sequence sub-model. As used herein, a tensor may refer to an algebraic object that describes a linear mapping from one set of algebraic objects (e.g., vectors, scalars) to another. For example, the tensor may include a multi-dimensional array of numerical values.

In some embodiments, the processing device 140 may obtain a series of data points based on the k-space dataset. The image reconstruction module 520 may sequentially input at least a part of the series of data points into the sequence sub-model. Further, the image reconstruction module 520 may output the feature representation(s) of the k-space dataset from the sequence sub-model. More descriptions of determining the feature representation(s) of the k-space dataset using the sequence sub-model may be found elsewhere in the present disclosure. See, e.g., FIG. 7 and the descriptions thereof.

The domain translation sub-model may be configured to determine the reconstructed image based on the feature representation of the k-space dataset. In some embodiments, the processing device 140 may input the feature representation into the domain translation sub-model. The processing device 140 may then output the reconstructed image from the domain translation sub-model. For example, the domain translation sub-model may include a convolutional neural network (CNN) model, a fully convolutional neural network (FCN) model, a generative adversarial network (GAN) model, a back propagation (BP) neural network model, a radial basis function (RBF) neural network model, a deep belief nets (DBN) neural network model, an Elman neural network model, or the like, or any combination thereof. More descriptions of generating the reconstructed image using the sequence sub-model and the domain translation sub-model may be found elsewhere in the present disclosure. See, e.g., FIG. 7 and the descriptions thereof.

In some embodiments, the image reconstruction model may be determined by the MRI system 100 (e.g., the processing device 140, a storage device (the storage device 150, the storage 320, the storage 490)) or a third party (e.g., an external device). In some embodiments, the MRI system 100 may determine and/or update the image reconstruction model offline and store the image reconstruction model in the storage device. In some embodiments, the image reconstruction model may be determined and/or updated (or maintained) by, e.g., the manufacturer of the MRI scanner or a vendor. For instance, the manufacturer or the vendor may load the image reconstruction model into the MRI system 100 or a part thereof (e.g., the processing device 140) before or during the installation of the MRI scanner and/or the processing device 140, and maintain or update image reconstruction model from time to time (periodically or not). The maintenance or update may be achieved by installing a program stored on a storage device (e.g., a compact disc, a USB drive, etc.) or retrieved from an external source (e.g., a server maintained by the manufacturer or vendor) via the network 120. The program may include a new model (e.g., a new image reconstruction model) or a part of a model that substitutes or supplements a corresponding part of the model.

In some embodiments, the image reconstruction model may be trained based on a plurality of training datasets. The image reconstruction model may be trained using a training algorithm. For example, the training algorithm may include a gradient descent algorithm, a Newton's algorithm, a Quasi-Newton algorithm, a Levenberg-Marquardt algorithm, a conjugate gradient algorithm, or the like, or any combination thereof. More descriptions of generating the image reconstruction model may be found elsewhere in the present disclosure. See, e.g., FIGS. 8-9 and the descriptions thereof.

In some embodiments of the present disclosure, the image reconstruction model may be generated by training a preliminary image reconstruction model based on the plurality of training k-space datasets. During the training, a reference image (also referred to as "reference reconstructed image") reconstructed based on a reference k-space dataset that is fully sampled may be a desired output of the preliminary image reconstruction model. Accordingly, the reconstructed image generated using the image reconstruction model based on a sub-sampled k-space dataset may have fewer artifacts compared to a reconstructed image generated using an inverse Flourier transform technique based on the same sub-sampled k-space dataset.

In some embodiments, the noise of the reference image may be reduced based on a noise reduction technique. During the training, the reference image with less noise may be a desired output of the preliminary image reconstruction model. Thus the image reconstruction model so trained may also be configured to reduce noise in the reconstructed image. In some embodiments, the noise reduction technique may use one or more filters. Exemplary filters may include a median filter, a sigma filter, a mean filter, a K-nearest-neighbor (K-NN) filter, a Wilcoxon filter, or the like, or any combination thereof.

It should be noted that the above description is merely provided for the purposes of illustration, and not intended to limit the scope of the present disclosure. For persons having ordinary skills in the art, multiple variations and modifications may be made under the teachings of the present disclosure. However, those variations and modifications do not depart from the scope of the present disclosure.

Figure 7:
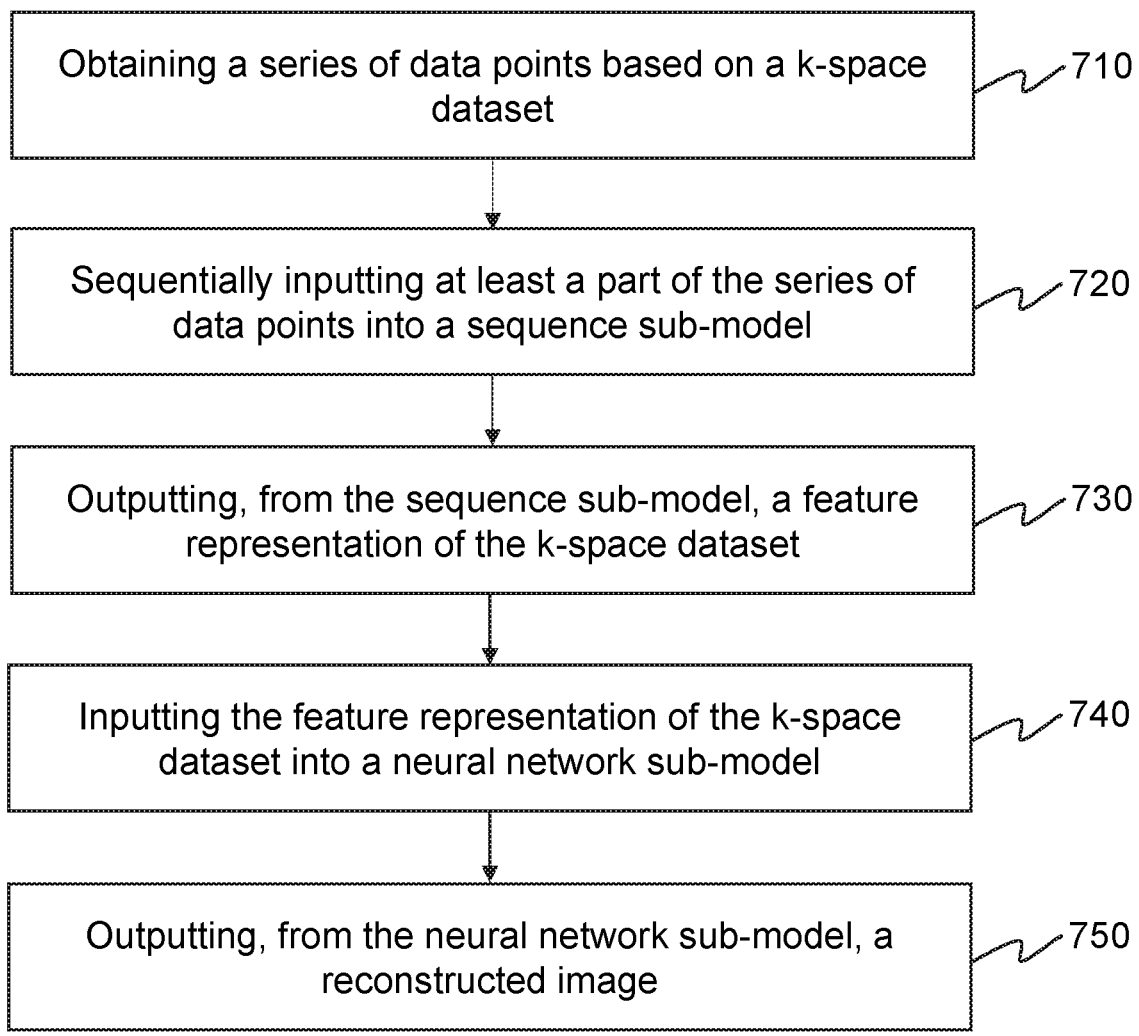
FIG. 7 is a flowchart illustrating an exemplary process for generating a reconstructed image based on a k-space dataset using an image reconstruction model according to some embodiments of the present disclosure.

FIG. 7 is a flowchart illustrating an exemplary process for generating a reconstructed image based on a k-space dataset using an image reconstruction model according to some embodiments of the present disclosure. In some embodiments, the process 700 may be implemented in the MRI system 100 illustrated in FIG. 1. For example, the process 700 may be stored in a storage medium (e.g., the storage device 150, or the storage 320 of the processing device 140) as a form of instructions, and can be invoked and/or executed by the processing device 140 (e.g., the processor 310 of the processing device 140, or one or more modules in the processing device 140 illustrated in FIG. 5). The operations of the illustrated process 700 presented below are intended to be illustrative. In some embodiments, the process 700 may be accomplished with one or more additional operations not described, and/or without one or more of the operations discussed. Additionally, the order in which the operations of the process 700 as illustrated in FIG. 7 and described below is not intended to be limiting. In some embodiments, operation 620 in process 600 may be implemented based on the process 700.

In 710, the processing device 140 (e.g., the image reconstruction module 520) may obtain a series of data points based on a k-space dataset. In some embodiments, each of the series of data points may correspond to a data point in the k-space dataset. In some embodiments, the processing device 140 may obtain the series of data points in the form of a vector, matrix or tensor. In some embodiments, the processing device 140 may reshape the k-space dataset (i.e., the plurality of data points) to the vector, matrix or tensor. For example, the processing device 140 may reshape the plurality of data points to a row vector. As another example, the processing device 140 may reshape the plurality of data points to a column vector.

As described in connection with 610, a data point in the k-space dataset may be represented as a complex value. In some embodiments, the complex value may be represented as a corresponding data point in the series of data points. In some embodiments, the corresponding data point in the series of data points may be represented in the form of a real part of the complex value and an imaginary part of the complex value. The data point in the k-space may include a magnitude component and a phase component. In some embodiments, the magnitude component and a phase component together may be represented as the corresponding data point in the series of data points.

In some embodiments, the processing device 140 may obtain additional information of the series of data points. For example, the additional information may include sub-sampling information of the series of data points, location information of the series of data points, timing information of the series of data points, etc. As used herein, the sub-sampling information may indicate whether a data point of the series of data points is a sampled data point or an unsampled data point. In some embodiments, in the sub-sampling information, the sampled data points and the unsampled data points may be marked differently. For example, sub-sampling information of a sampled data point may be represented by 1, while an unsampled data point may be represented by 0. In some embodiments, the processing device 140 may generate a series of second data points including the sub-sampling information of the series of data points. In some embodiments, the processing device 140 may obtain the series of second data points in the form of a vector, matrix or tensor. For example, the second vector may include a row vector or a column vector. By selectively omitting unsampled data points, the size of the series of data points (e.g., in the form of a vector, matrix, or tensor) may be reduced, thereby reducing the amount of data points to be processed for image reconstruction without sacrificing the quality of the resultant image.

As used herein, location information of a data point may refer to a location of the data point in the k-space. In some embodiments, the location of the data point may include a coordinate of the data point in a coordinate system associated with the k-space. In some embodiments, the coordinate system may be a 2D coordinate system. The location information of the data point may include information regarding the x coordinate and the y coordinate of the corresponding data point in the k-space dataset. For example, the center of the 2D coordinate system may be a vertex (e.g., an upper left vertex, an upper right vertex) of the k-space. As another example, the center of the 2D coordinate system may be the center of the k-space. In some embodiments, the coordinate system may be a 3D coordinate system. The location information of the data point may include information regarding the x coordinate, the y coordinate, and the z coordinate of the corresponding data point in the k-space dataset. In some embodiments, information regarding the coordinates of a data point in the k-space dataset may include the absolute value of the coordinates, a distance from a reference point whose coordinates are known, or other information on the basis of which the coordinates may be determined.

In some embodiments, the processing device 140 may also incorporate location information of the k-space data in further processing. For example, the at least one series of data points may include a series of third data points including first coordinates (e.g., information regarding to the x coordinate) of the series of data points or a part thereof, a series of fourth data points including second coordinates (e.g., information regarding the y coordinate) of the series of data points or a part thereof, a series of fifth data points including third coordinates (e.g., information regarding the z coordinate) of the series of data points or a part thereof, etc. In some embodiments, the processing device 140 may obtain the at least one series of data points in the form of at least one vector or matrix. For example, the at least one vector (or matrix or tensor) may include a third vector (or matrix or tensor) including the series of third data points or a part thereof, a fourth vector (or matrix or tensor) including the series of fourth data points or a part thereof, a fifth vector (or matrix or tensor) including the series of fifth data points or a part thereof, etc. For example, the at least one vector may include a row vector or a column vector.

In some embodiments, the processing device 140 may concatenate at least a part of the series of data points (e.g., the series of second data points, the series of third data points, the series of forth data points, the series of fifth data points) with respect to the additional information and the series of data points or a part thereof. For example, the processing device 140 may concatenate the series of data points and the series of second data points. As another example, the processing device 140 may concatenate the series of data points, the series of second data points, the series of third data points, and the series of forth data points. As a further example, the processing device 140 may concatenate the series of data points, the series of second data points, the series of third data points, the series of forth data points, and the series of fifth data points. In some embodiments, the processing device 140 may further input the series of concatenated data points into the sequence sub-model. For example, the series of concatenated data points may be arranged in a matrix, and the processing device 140 may input at least a part thereof into the sequence sub-model. As another example, the additional information may be added into the vector, and the processing device 140 may input at least a part thereof into the sequence sub-model.

In some embodiments, the processing device 140 may obtain the series of data points (e.g., the vector (or matrix or tensor) and/or the vector(s) (or matrix(es) or tensor(s))) with respect to the additional information according to a sequence or rule. For example, if the plurality of data points in the k-space data are arranged in a matrix, the processing device 140 may obtain the vector by retrieving and/or reshaping the plurality of data points by row or by column. Accordingly, the processing device 140 may obtain the vector(s) with respect to the additional information by retrieving and/or reshaping the additional information of the plurality of data points by row or by column. As another example, the processing device 140 may obtain the matrix(es) to be input to the sequence sub-model with respect to the additional information by retrieving and/or reshaping the plurality of data points according to the dimension of a matrix. As a further example, each of the tensor(s) to be input to the sequence sub-model may have a specified dimension (e.g., 3, 5). The processing device 140 may obtain the tensor(s) to be input to the sequence sub-model with respect to the additional information by retrieving and/or reshaping the plurality of data points according to the specified dimension. In some embodiments, if the vector includes the location information of the series of data points, the processing device 140 may obtain the vector by retrieving and/or reshaping the plurality of data points randomly. Accordingly, the processing device 140 may obtain the vector(s) with respect to the additional information by retrieving and/or reshaping the additional information of the plurality of data points randomly. The reformatting the k-space dataset and/or the additional information of the k-space dataset to vectors may change the data points of the k-space dataset that are spatially related to data points arranged in the form of a vector that resembles a time series of data points and facilitates sequential or series processing. This reformatting may obviate the need to process the k-space dataset as a whole in its original format (e.g., a 2D matrix, a 3D matrix) which may consume a large amount of memory. In addition, a model that is configured to process a k-space dataset of a certain dimension (e.g., a 256×256 matrix) may be inapplicable to process a k-space dataset of a different dimension (e.g., a 64×64 matrix). Therefore, multiple models need to be developed to meet the needs of processing k-space datasets of different dimensions. However, by reformatting to the form of a vector, k-space datasets of different dimensions may be processed by a same model, obviating the need to develop different models for processing such k-space datasets of different dimensions.

In 720, the processing device 140 (e.g., the image reconstruction module 520) may sequentially input at least a part of the series of data points (e.g., in the form of the vector, matrix or tensor) into a sequence sub-model. In some embodiments, the processing device 140 may sequentially input the series of data points (e.g., in the form of the vector, matrix or tensor) determined in 710 into the sequence sub-model. In some embodiments, the processing device 140 may input a part of the series of data points into the sequence sub-model. In some embodiments, the input of the sequence sub-model may include, besides the at least a part of the series of data points (e.g., in the form of a vector, matrix, or tensor), additional information of these data points (e.g., the sub-sampling information, the location information, the timing information, or the like, or a combination thereof). For example, the image reconstruction module 520 may obtain one or more concatenated vectors, matrices, or tensors by combining the series of the data points and the additional information of the series of data points, and retrieve, from the one or more concatenated vectors, matrices, or tensors, input to the sequence sub-model. Before inputting the series of data points (or the series of concatenated data points) into the sequence sub-model, the processing device 140 may remove data points of the series of data points (or the series of concatenated data points) corresponding to the unsampled data points (e.g., the data points assigned with zero) in the k-space dataset from the series of data points based on the sub-sampling information. For illustration purposes, the series of data points (or the series of concatenated data points) may include only data points corresponding to the sampled data points in the k-space. The series of concatenated data points may include the data points corresponding to the sampled data points in the k-space and additional information thereof.

The step length or the number (or count) of the data points that is input into the sequence sub-model may be selected based on one or more factors including, e.g., the amount of storage available, the processing capacity of the processing device 140, desired speed or time of image reconstruction, etc. Different step lengths may be used in different image reconstruction operations. For instance, the step length in a specific image reconstruction operation may be determined by the processing device 140 based on operational parameters (e.g., a goal of the image reconstruction operation (e.g., some applications of the image reconstruction needs a fast processing than other applications), a desired speed or time of image reconstruction) specified by a user, configurations of the processing device 140 (e.g., the amount of memory available, the processing capacity), or the like, or a combination thereof.

In 730, the processing device 140 (e.g., the image reconstruction module 520) may output, from the sequence sub-model, a feature representation of the k-space dataset. As described in FIG. 6, the feature representation may include a low-level feature (e.g., an edge feature, a texture feature) in a k-space domain corresponding to the k-space dataset, a high-level feature (e.g., a semantic feature) in the k-space domain, a complicated feature (e.g., a deep hierarchical feature) in the k-space domain, etc. In some embodiments, the feature representation may be represented by a vector, and the length of the vector may be smaller than the length of the vector input into the sequence sub-model. For example, the sequence sub-model may include a simple recurrent network (SRN) model, a gated sequence model (e.g., an LSTM network model), a stacked recurrent neural network (SRNN) model, a bi-directional recurrent network model, a recursive neural network (RecNN) model, a graph network model, a convolutional neural network (CNN) model, a transformer (e.g., a transformer XL, a bidirectional encoder representation from transformer (BERT)), etc.

In some embodiments, the processing device 140 may obtain the sequence sub-model from a storage device (e.g., the storage device 150, the storage 320, the storage 490) or an external device described elsewhere in the present disclosure. In some embodiments, the sequence sub-model may be predetermined based on a plurality of training k-space dataset by the MRI system 100 or the external device, and may be stored in the storage device or the external device. More descriptions of determining the sequence sub-model may be found elsewhere in the present disclosure. See, e.g., FIGS. 8-9, and the descriptions thereof.

In 740, the processing device 140 (e.g., the image reconstruction module 520) may input the feature representation of the k-space dataset into a domain translation sub-model. For example, the domain translation sub-model may include convolutional neural network (CNN) model, a fully convolutional neural network (FCN) model, a generative adversarial network (GAN) model, a back propagation (BP) neural network model, a radial basis function (RBF) neural network model, a deep belief nets (DBN) neural network model, an Elman neural network model, etc.

In some embodiments, the feature representation may mismatch the input of the domain translation sub-model. For example, a first length of a vector representing the feature representation may be different from a second length of an input vector of the domain translation sub-model. In this case, a first layer of the domain translation sub-model may be a convolutional layer. The convolutional layer may transform the vector including the feature representation to have the second length, thereby matching the input of the domain translation sub-model.

In some embodiments, the processing device 140 may obtain the domain translation sub-model from a storage device (e.g., the storage device 150, the storage 320, the storage 490) or an external device described elsewhere in the present disclosure. In some embodiments, the domain translation sub-model may be predetermined based on a plurality of training k-space dataset by the MRI system 100 or the external device, and may be stored in the storage device or the external device. More descriptions of determining the domain translation sub-model may be found elsewhere in the present disclosure. See, e.g., FIGS. 8-9, and the descriptions thereof.

In 750, the processing device 140 (e.g., the image reconstruction module 520) may output, from the domain translation sub-model, a reconstructed image. In some embodiments, the domain translation sub-model may extract feature information of the feature representation of the k-space dataset, and determine the reconstructed image based on the feature information. In some embodiments, the feature information may include a feature representation of the k-space dataset in an image domain. The domain translation sub-model may map or translate the feature representation in the k-space domain to the feature representation in the image domain. Similar to the feature representation in the k-space domain, the feature information may include a low-level feature (e.g., an edge feature, a texture feature) in the image domain, a high-level feature (e.g., a semantic feature) in the image domain, a complicated feature (e.g., a deep hierarchical feature) in the image domain, etc.

In some embodiments, the sequence sub-model and the domain translation sub-model may include one or more skip-connection structures. The skip-connection structure may allow an additional feature representation and/or the additional information (e.g., characteristic information including the sub-sampling information, the location information, the timing information) or a part thereof of the k-space dataset to be transmitted from the sequence sub-model to the domain translation sub-model. The domain translation sub-model may determine the reconstructed image based on the feature representation, the additional feature representation, and/or the additional information or a part thereof. For example, a first layer (or unit) of the sequence sub-model may be connected to a second layer (or unit) of the domain translation sub-model through the skip-connection structure. As another example, two or more layers (or units) of the sequence sub-model may be connected to two or more layers (units) of the domain translation sub-model through two or more skip-connection structures, respectively. Since a first length of output data (e.g., an output vector) of the first layer may be different from a second length of input data (e.g., an input vector) of the second layer, the skip-connection structure may also include a convolutional layer. The convolutional layer may transform the output data including the additional feature representation and/or the additional information or a part thereof to have the second length, thereby matching the input data of the second layer.

It should be noted that the above description is merely provided for the purposes of illustration, and not intended to limit the scope of the present disclosure. For persons having ordinary skills in the art, multiple variations and modifications may be made under the teachings of the present disclosure. However, those variations and modifications do not depart from the scope of the present disclosure.

Figure 8:
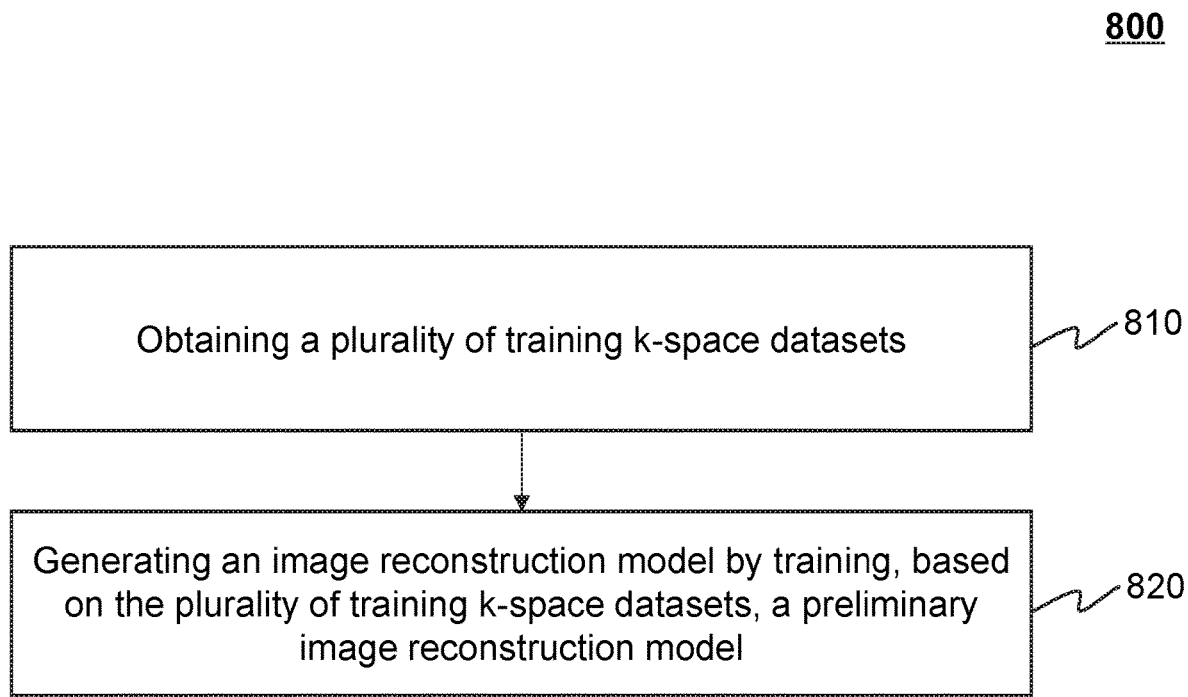
FIG. 8 is a flowchart illustrating an exemplary process for generating an image reconstruction model according to some embodiments of the present disclosure.

FIG. 8 is a flowchart illustrating an exemplary process for generating an image reconstruction model according to some embodiments of the present disclosure. In some embodiments, the process 800 may be implemented in the MRI system 100 illustrated in FIG. 1. For example, the process 800 may be stored in a storage medium (e.g., the storage device 150, or the storage 320 of the processing device 140) as a form of instructions, and can be invoked and/or executed by the processing device 140 (e.g., the processor 310 of the processing device 140, or one or more modules in the processing device 140 illustrated in FIG. 5). The operations of the illustrated process 800 presented below are intended to be illustrative. In some embodiments, the process 800 may be accomplished with one or more additional operations not described, and/or without one or more of the operations discussed. Additionally, the order in which the operations of the process 800 as illustrated in FIG. 8 and described below is not intended to be limiting. In some embodiments, the image reconstruction model as illustrated in FIGS. 5-6 may be generated based on the process 800.

In 810, the processing device 140 (e.g., the model training module 530) may obtain a plurality of training k-space datasets. Similar to the k-space dataset as illustrated in FIGS. 6-7, a training k-space dataset may be further used to generate a reconstructed training image. The training k-space dataset may include a plurality of training data points representing spatial frequencies of pixels in the reconstructed training image. In some embodiments, the plurality of training k-space datasets may include one or more sub-sampled training k-space datasets, one or more training k-space datasets that are fully sampled, etc. In some embodiments, a first part of the sub-sampled training k-space datasets may be directly acquired by an MRI scanner (e.g., the MRI scanner 110).

In some embodiments, the processing device 140 may obtain a second part of the sub-sampled training k-space datasets by sub-sampling one or more reference k-space datasets that are fully sampled. In some embodiments, the processing device 140 may generate the one or more reference k-space datasets according to MR signals generated by scanning different subjects or different parts of a subject. For each of the one or more reference k-space datasets, the processing device 140 may subsample the reference k-space dataset based on one or more training sampling masks. Similar to the sampling mask as illustrated in FIG. 5, the training sampling mask may include a binary matrix, where "1" means that a training data point (also referred to as sampled training data point") in a training k-space is sampled, and "0" means that a training data point (also referred to as "unsampled training data point") in the training k-space is not sampled. For illustration purposes, the processing device 140 may assign the unsampled training data points with one or more initial values, e.g., zero.

For example, the training sampling mask(s) may include a 2D random sampling mask, a pseudo-radial sampling mask, a Cartesian sampling mask, etc. In some embodiments, the training sampling mask(s) may be specified for the MRI system 100 (e.g., the MRI scanner 110) based on the type thereof. Accordingly, the processing device 140 may select the training sampling mask(s) based on the type of the MRI system 100. The training k-space datasets used to train a preliminary image reconstruction model may be determined further based on the specified training sampling mask specified for the type of MRI system 100. For example, if a sub-sampling pattern or trajectory determined by a Cartesian sampling mask is suitable (e.g., providing better quality of a reconstructed training image) for the type of the MRI system 100, the sampling mask may include the Cartesian sampling mask. In some embodiments, the selection of a suitable training sampling mask may be achieved based on a user input.

In 820, the processing device 140 (e.g., the model training module 530) may generate the mage reconstruction model by training, based on the plurality of training k-space datasets, a preliminary image reconstruction model. In some embodiments, each of the plurality of training k-space datasets may include a plurality of training data points, the processing device 140 may remove unsampled training data points (e.g., the training data points assigned with zero) based on sub-sampling information of the training k-space dataset. In some embodiments, the processing device 140 may obtain additional training information of the plurality of training data points (or the remaining training data points after a portion of the training data points, e.g., the unsampled training data points, are removed) for each of the plurality of training k-space dataset. In some embodiments, the processing device 140 may generate the image reconstruction model based on the plurality of training data points (or the remaining training data points) and/or the additional information thereof. For example, the additional training information may include training sub-sampling information of the plurality of training data points (or the remaining training data points), training location information of the plurality of training data points (or the remaining training data points), training timing information of the plurality of training data points (or the remaining training data points), etc.

In some embodiments, the processing device 140 may obtain a series of training data points based on the plurality of data points in each training dataset. In some embodiments, the processing device 140 may obtain the series of training data points in the form of a training vector (or matrix or tensor). As used herein, a training vector (or matrix or tensor) may correspond to a training k-space dataset. The processing device 140 may obtain the training vector (or matrix or tensor) based on a process similar to the process for obtaining the vector (or matrix) including the series of data points as illustrated in FIGS. 6-7. In some embodiments, the processing device 140 may generate the image reconstruction model by training, based on the plurality of series of training data points (e.g., the training vector (or matrix or tensor), the preliminary image reconstruction model.

In some embodiments, each of the series of training data points may correspond to a training data point in the training k-space dataset. A training data point in the training k-space dataset may be represented as a complex value. In some embodiments, a corresponding training data point in the series of training data points (e.g., the training vector (or matrix or tensor) may be represented as the complex value. In some embodiments, the corresponding training data point in the series of training data points (e.g., the training vector (or matrix or tensor)) may be represented as a real part of the complex value and an imaginary part of the complex value. The training data point in the training k-space may include a magnitude component and a phase component. In some embodiments, the magnitude component and a phase component together may be represented as the corresponding training data point in the series of training data points (e.g., the training vector (or matrix or tensor)).

In some embodiments, the processing device 140 may obtain additional training information of the series of training data points. For example, the additional training information may include training sub-sampling information (e.g., a sampled training data point or an unsampled training data point) of the series of training data points, training location information of the series of training data points, training timing information of the series of training data points, etc. For example, training sub-sampling information of a sampled training data point may be represented by 1. Training sub-sampling information of an unsampled training data point may be represented by 0. In some embodiments, the processing device 140 may generate a series of second training data points including the training sub-sampling information of the series of training data points. In some embodiments, the processing device 140 may obtain the series of second training data points in the form of a second training vector, matrix or tensor.

As used herein, training location information of a training data point may refer to a location of the training data point in the training k-space. In some embodiments, the location of the training data point may be represented by a coordinate of the training data point in a coordinate system associated with the training k-space. In some embodiments, the coordinate system may be a 2D coordinate system. The training location information of the training data point may include information regarding the x coordinate and y coordinate of the corresponding training data point in the training k-space dataset. For example, the center of the 2D coordinate system may be a vertex (e.g., an upper left vertex, an upper right vertex) of the training k-space. As another example, the center of the 2D coordinate system may be the center of the training k-space. In some embodiments, the coordinate system may be a 3D coordinate system. The training location information of the training data point may include information regarding x coordinate, y coordinate, and z coordinate of the corresponding training data point in the training k-space dataset.

In some embodiments, the processing device 140 may also generate at least one series of training data points with respect to the location information. The at least one series of training data points may include a series of third training data points including first coordinates (e.g., information regarding the x coordinate) of the series of training data points or a part thereof, a series of fourth training data points including second coordinates (e.g., information regarding the y coordinate) of the series of training data points or a part thereof, a series of fifth training data points including third coordinates (e.g., information regarding the z coordinate) of the series of training data points or a part thereof, etc. In some embodiments, the processing device 140 may obtain the at least one series of training data points into the form of at least one training vector or matrix. For example, the at least one training vector (or matrix) may include a third training vector (or matrix) including the series of third training data points or a part thereof, a fourth training vector (or matrix) including the series of fourth training data points or a part thereof, a fifth training vector (or matrix) including the series of fifth training data points or a part thereof, etc.

In some embodiments, the processing device 140 may concatenate at least a part of the series of training data points (e.g., the series of second training data points, the series of third training data points, the series of fourth training data points, the series of fifth training data points) with respect to the additional training information with the series of training data points. For example, the processing device 140 may concatenate the series of training data points and the series of second training data points. As another example, the processing device 140 may concatenate the series of training data points and the series of second training data points, the series of third training data points, and the series of fourth training data points. As a further example, the processing device 140 may concatenate the series of training data points and the series of second training data points, the series of third training data points, the series of fourth training data points, and the series of fifth training data points.

In some embodiments, the processing device 140 may obtain the series of training data points (e.g., the training vector (or matrix or tensor) and/or the training vector(s) (or matrix(es) or tensor(s))) with respect to the additional training information according to a training sequence or rule. For example, if the plurality of training data points in the training k-space dataset are arranged in a matrix, the processing device 140 may obtain the training vector by retrieving and/or reshaping the plurality of training data points by row or by column. Accordingly, the processing device 140 may obtain the training vector(s) with respect to the additional training information by retrieving and/or reshaping the additional training information of the plurality of training data points by row or by column. As another example, the processing device 140 may obtain the training matrix(es) to be input to the sequence sub-model with respect to the additional training information by retrieving and/or reshaping the plurality of training data points according to the dimension of a matrix. As a further example, each of the training tensor(s) to be input to the sequence sub-model may have a specified dimension (e.g., 3, 5). The processing device 140 may obtain the training tensor(s) to be input to the sequence sub-model with respect to the additional training information by retrieving and/or reshaping the plurality of training data points according to the specified dimension. In some embodiments, if the training vector includes the training location information of the series of training data points, the processing device 140 may obtain the training vector by retrieving and/or reshaping the plurality of training data points randomly. Accordingly, the processing device 140 may obtain the training vector(s) with respect to the additional training information by retrieving and/or reshaping the additional training information of the plurality of training data points randomly.

In some embodiments, the processing device 140 may generate the image reconstruction model by performing a plurality of iterations to iteratively update one or more parameters of the preliminary image reconstruction model. In some embodiments, the preliminary image reconstruction model may include a preliminary sequence sub-model and a preliminary domain translation sub-model. The processing device 140 may generate the image reconstruction model by iteratively updating the one or more parameters of the preliminary sequence sub-model and/or the preliminary domain translation sub-model. For example, the parameters may include the size of a kernel of a layer, the total count (or number) of layers, a count (or number) of nodes in a layer, a learning rate, a batch size, an epoch, a connected weight between two connected nodes, a bias vector relating to a node, an activation vector of a node in a layer, etc.

In some embodiments, the processing device 140 may generate the image reconstruction model based on a training algorithm. For example, the training algorithm may include a gradient descent algorithm, Newton's algorithm, a Quasi-Newton algorithm, a Levenberg-Marquardt algorithm, a conjugate gradient algorithm, or the like, or any combination thereof. More descriptions may be found elsewhere in the present disclosure. See, e.g., FIG. 9 and the descriptions thereof.

It should be noted that the above description is merely provided for the purposes of illustration, and not intended to limit the scope of the present disclosure. For persons having ordinary skills in the art, multiple variations and modifications may be made under the teachings of the present disclosure. However, those variations and modifications do not depart from the scope of the present disclosure.

Figure 9:
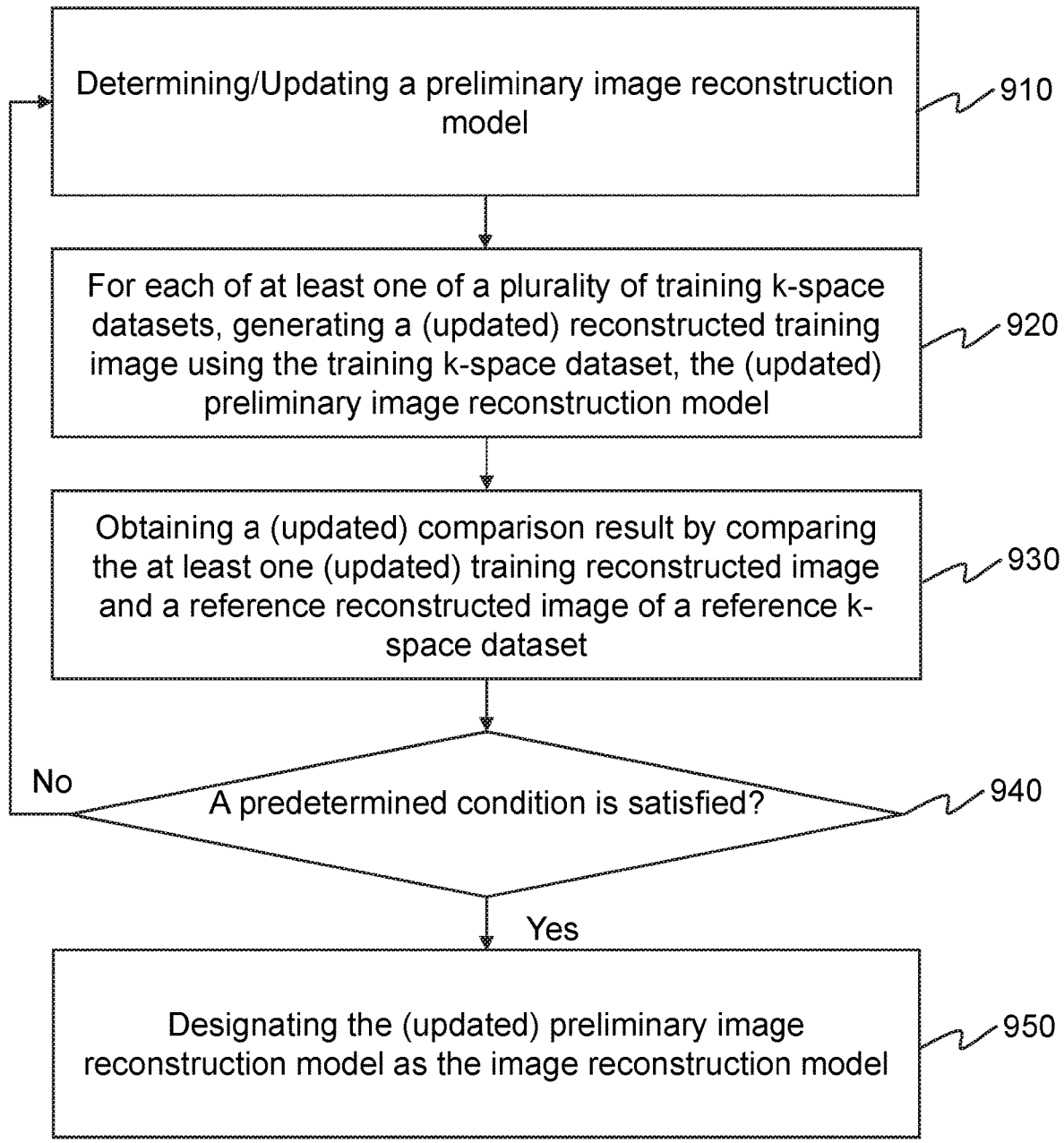
FIG. 9 is a flowchart illustrating an exemplary process for generating an image reconstruction model according to some embodiments of the present disclosure.

FIG. 9 is a flowchart illustrating an exemplary process for generating an image reconstruction model according to some embodiments of the present disclosure. In some embodiments, the process 900 may be implemented in the MRI system 100 illustrated in FIG. 1. For example, the process 900 may be stored in a storage medium (e.g., the storage device 150, or the storage 320 of the processing device 140) as a form of instructions, and can be invoked and/or executed by the processing device 140 (e.g., the processor 310 of the processing device 140, or one or more modules in the processing device 140 illustrated in FIG. 5). The operations of the illustrated process 900 presented below are intended to be illustrative. In some embodiments, the process 900 may be accomplished with one or more additional operations not described, and/or without one or more of the operations discussed. Additionally, the order in which the operations of the process 900 as illustrated in FIG. 9 and described below is not intended to be limiting. In some embodiments, operation 820 in the process 800 may be implemented based on the process 900.

In 910, the processing device 140 (e.g., the model training module 530) may determine or obtain a preliminary image reconstruction model. The preliminary image reconstruction model may include a preliminary sequence sub-mode and a preliminary domain translation sub-model. In some embodiments, the structure of the preliminary sequence sub-model may include, e.g., an input layer, a hidden layer, a simple recurrent unit (SRU), a gated unit, a long-short-term memory (LSTM) unit, a bi-direction recurrent unit, an attention layer, an output layer, etc. The preliminary sequence sub-model may include a simple recurrent network (SRN) model, a gated sequence model (e.g., an LSTM network model), a stacked recurrent neural network (SRNN) model, a bi-directional recurrent network model, a recursive neural network (RecNN) model, a graph network model, a convolutional neural network (CNN) model, a transformer (e.g., a transformer XL, a bidirectional encoder representation from transformer (BERT)), etc. For illustration purposes, the preliminary sequence sub-model may be an LSTM network model including an input layer, an LSTM unit, an output layer, etc. The LSTM unit may include three gates, i.e., an input gate, a forget gate, and an output gate.

In some embodiments, the structure of the preliminary domain translation sub-model may include, e.g., an input layer, a convolutional layer, a pooling layer, a fully-connected layer, an output layer, a generator, a discriminator, etc. Accordingly, the preliminary domain translation sub-model may include a convolutional neural network (CNN) model, a fully convolutional neural network (FCN) model, a generative adversarial network (GAN) model, a back propagation (BP) neural network model, a radial basis function (RBF) neural network model, a deep belief nets (DBN) neural network model, an Elman neural network model, etc. For illustration purposes, the preliminary domain translation sub-model may be a CNN model including the input layer, one or more convolutional layers, one or more pooling layers, one or more fully-connected layers, an output layer, etc.

In some embodiments, the preliminary sequence sub-model and the preliminary domain translation sub-model may include a plurality of parameters (also referred to as "training parameters"). For example, the training parameters may include the size of a kernel of a layer, the total count (or number) of layers, the count (or number) of nodes in a layer, a learning rate, a batch size, an epoch, a connected weight between two connected nodes, a bias vector relating to a node, an activation vector of a node in a layer, or the like, or any combination thereof.

In some embodiments, the processing device 140 may initialize or set the training parameters. For example, the processing device 140 may set a connected weight to be a random value in a range from −1 to 1. As another example, the processing device 140 may set a bias vector to be a random value in a range from 0 to 1. In some embodiments, the processing device 140 may initialize or set the parameters based on a Gaussian random algorithm, a Xavier algorithm, etc.

In 920, for each of at least one of the plurality of training k-space datasets as illustrated in FIG. 8, the processing device 140 (e.g., the model training module 530) may generate a reconstructed training image using the training k-space dataset (e.g., a corresponding training vector, matrix, or tensor, or a corresponding concatenated training vector, matrix, or tensor), the preliminary or an updated sequence sub-model, and the preliminary or an updated domain translation sub-model. As described in FIG. 8, the processing device 140 may generate the image reconstruction model by performing a plurality of iterations to iteratively update one or more parameters of the preliminary sequence sub-model and the preliminary domain translation sub-model. The updated sequence sub-model used herein may be generated using one of the at least one of the plurality of training k-space datasets (e.g., a corresponding training vector, matrix, or tensor, or a corresponding concatenated training vector, matrix, or tensor) in one iteration of the plurality of iterations. The updated domain translation sub-model used herein may be generated using the one of the at least one of the plurality of training k-space datasets (e.g., a corresponding training vector, matrix, or tensor, or a corresponding concatenated training vector, matrix, or tensor) in the iteration of the plurality of iterations.

In some embodiments, the processing device 140 may generate a plurality of reconstructed training images of the plurality of training k-space datasets (e.g., corresponding training vector, matrix or tensor, or corresponding concatenated training vector, matrix or tensor). In some embodiments, the processing device 140 may generate at least one reconstructed training image of the at least one of the plurality of training k-space datasets (e.g., at least one corresponding training vector, matrix or tensor, or at least one corresponding concatenated training vector, matrix, or tensor). The process for generating the reconstructed training image may be similar to the process for generating the reconstructed image as illustrated in FIGS. 6-7. The processing device 140 may input at least a part of the training k-space dataset (e.g., a corresponding training vector matrix or tensor, or a corresponding concatenated training vector, matrix or tensor) into an intermediate sequence sub-model that relates to the preliminary sequence sub-model. For example, the processing device 140 may obtain a training tensor by concatenating the plurality of training data points (or the remaining training data points) and the additional training information of the plurality of training data points (or the remaining training data points), and input at least a part of the training tensor into the intermediate sequence sub-model. As used herein, a training tensor may refer to an algebraic object that describes a linear mapping from one set of algebraic objects (e.g., vectors, scalars) to another. For example, the training tensor may include a multi-dimensional array of numerical values. As used herein, an intermediate sequence sub-model may be obtained by iteratively updating the preliminary sequence sub-model in the training process using the training k-space datasets. For instance, parameters of the preliminary sequence sub-model may be iteratively updated in the training process to provide an iteratively updated intermediate sequence sub-model. The intermediate sequence sub-model may output a training feature representation of the training k-space dataset (e.g., a corresponding training vector matrix or tensor, or a corresponding concatenated training vector, matrix or tensor). Further, the processing device 140 may input the training feature representation into an intermediate domain translation sub-model that relates to the preliminary domain translation sub-model. As used herein, an intermediate domain translation sub-model may be obtained by iteratively updating the preliminary domain translation sub-model in the training process using the training k-space datasets. For instance, parameters of the preliminary domain translation sub-model may be iteratively updated in the training process to provide an iteratively updated intermediate domain translation sub-model. The intermediate domain translation sub-model may output the reconstructed training image. More descriptions for generating the reconstructed training image may be found in FIGS. 6-7, and are not repeated here.

In some embodiments, the preliminary or updated sequence sub-model and the preliminary or updated domain translation sub-model may include one or more skip-connection structures. The skip-connection may allow an additional training feature representation and/or the additional training information or a part thereof of the training k-space dataset to be transmitted from the preliminary or updated sequence sub-model to the preliminary or updated domain translation sub-model. The preliminary or updated domain translation sub-model may determine the reconstructed training image based on the training feature representation and the additional training feature representation. For example, a first layer (or unit) of the preliminary or updated sequence sub-model may be connected to a second layer (or unit) of the preliminary or updated domain translation sub-model through the skip-connection structure. As another example, two or more layers (or units) of the preliminary or updated sequence sub-model may be connected to two or more layers (units) of the preliminary and updated domain translation sub-model through two or more skip-connection structures, respectively. Since a first length of output data (e.g., an output vector or matrix) of the first layer may be different from a second length of input data (e.g., an input vector or matrix) of the second layer, the skip-connection structure may also include a convolutional layer. The convolutional layer may transform the output data including the additional training feature representation and/or the additional training information or a part thereof to have the second length, thereby matching the input data of the second layer.

In 930, the processing device 140 (e.g., the model training module 530) may obtain a comparison result by comparing a reconstructed training image generated based on a training k-space dataset and a reference reconstructed image. In some embodiments, the reference reconstructed image may be obtained based on a reference k-space dataset that corresponds to the training k-space dataset. As used herein, the training k-space dataset may be a sub-sampled k-space dataset corresponding to the reference k-space dataset. In some embodiments, the reference k-space dataset may be fully sampled. The reference reconstructed image may be a desired output of the preliminary or updated domain translation sub-model. The processing device 140 may generate the reference reconstructed image based on the reference k-space dataset using an MR image reconstruction technique. For example, the MR image reconstruction technique may include a 2-dimensional Fourier transform technique, a back projection technique (e.g., a convolution back projection technique, a filtered back projection technique), an iterative reconstruction technique, etc. Exemplary iterative reconstruction techniques may include an algebraic reconstruction technique (ART), a simultaneous iterative reconstruction technique (SIRT), a simultaneous algebraic reconstruction technique (SART), an adaptive statistical iterative reconstruction (ASIR) technique, a model-based iterative reconstruction (MBIR) technique, a sinogram affirmed iterative reconstruction (SAFIR) technique, or the like, or any combination thereof.

In some embodiments, as illustrated in FIG. 8, the plurality of training k-space datasets may correspond to two or more reference k-space datasets. That a training k-space dataset corresponding to a reference k-space dataset as used herein may refer to that the training k-space dataset is a sub-sampled k-space dataset of the reference k-space dataset.

The comparison result may assess a difference between a reconstructed training image and the corresponding reference reconstructed image. In some embodiments, the processing device 140 may determine an objective function based on the difference as the comparison result. For example, the objective function may include a loss function of the difference, a Root Mean Square Error (RMSE) function, a Mean Absolute Error (MAE) function, etc.

In 940, the processing device 140 (e.g., the model training module 530) may determine whether to terminate the training process by determining whether a predetermined condition is satisfied. In some embodiments, the predetermined condition may relate to the comparison result between a training reconstructed image generated based on a training k-space dataset and a reference reconstructed image. In response to the determination that the predetermined condition is satisfied, the processing device 140 (e.g., the model training module 530) may designate the preliminary or updated sequence sub-model and the preliminary or updated domain translation sub-model as the sequence sub-model and the domain translation sub-model, respectively, in 950. On the other hand, in response to the determination that the predetermined condition is not satisfied, the processing device 140 may return to operation 910 to further update the preliminary sequence sub-model (or an updated sequence sub-model generated in the preceding round of training based on a training k-space dataset) and the preliminary domain translation sub-model (or an updated domain translation sub-model generated in the preceding round of training). In some embodiments, the processing device 140 may update the preliminary or updated sequence sub-model and the preliminary or updated domain translation sub-model using at least a part of the at least one of the plurality of training k-space datasets (e.g., corresponding training vectors, matrix or tensor, or corresponding concatenated training vector, matrix or tensor). In some embodiments, the processing device 140 may update at least a part of the training parameters based on the at least a part of the at least one of the plurality of training k-space datasets (e.g., corresponding training vector, matrix or tensor, or corresponding concatenated training vector, matrixes or tensor).

In some embodiments, the predetermined condition may be satisfied if the value of the objective function is (locally or globally) minimal or smaller than a threshold (e.g., a constant). In some embodiments, the predetermined condition may be satisfied if the value of the objective function converges. The convergence may be deemed to have occurred if the variation of the values of the objective function in two or more consecutive iterations is smaller than a threshold (e.g., a constant).

In some embodiments, the predetermined condition may include, additionally or alternatively, whether a specified count (or number) of iterations (or rounds of training) have been performed, whether parameters of the intermediate sequence sub-model or the intermediate domain translation sub-model converge within a certain rounds (e.g., three rounds, five rounds) of training, etc. For instance, the predetermined condition may be deemed satisfied when the objective function based on the comparison result is (locally or globally) minimal or smaller than a threshold (e.g., a constant) and at least a certain count or number of iterations (or rounds of training) have been performed. As another example, the predetermined condition may be deemed satisfied either when the objective function based on the comparison result converges or when parameters of the intermediate sequence sub-model and parameters of the intermediate domain translation sub-model converge within a certain rounds (e.g., three rounds, five rounds) of training. In some embodiments, the processing device 140 may transmit the sequence sub-model, the domain translation sub-model, and the image reconstruction model, to a storage device (e.g., the storage device 150, the storage 320, and the storage 490) for storage.

It should be noted that the above description is merely provided for the purposes of illustration, and not intended to limit the scope of the present disclosure. For persons having ordinary skills in the art, multiple variations and modifications may be made under the teachings of the present disclosure. However, those variations and modifications do not depart from the scope of the present disclosure.

Figure 10:
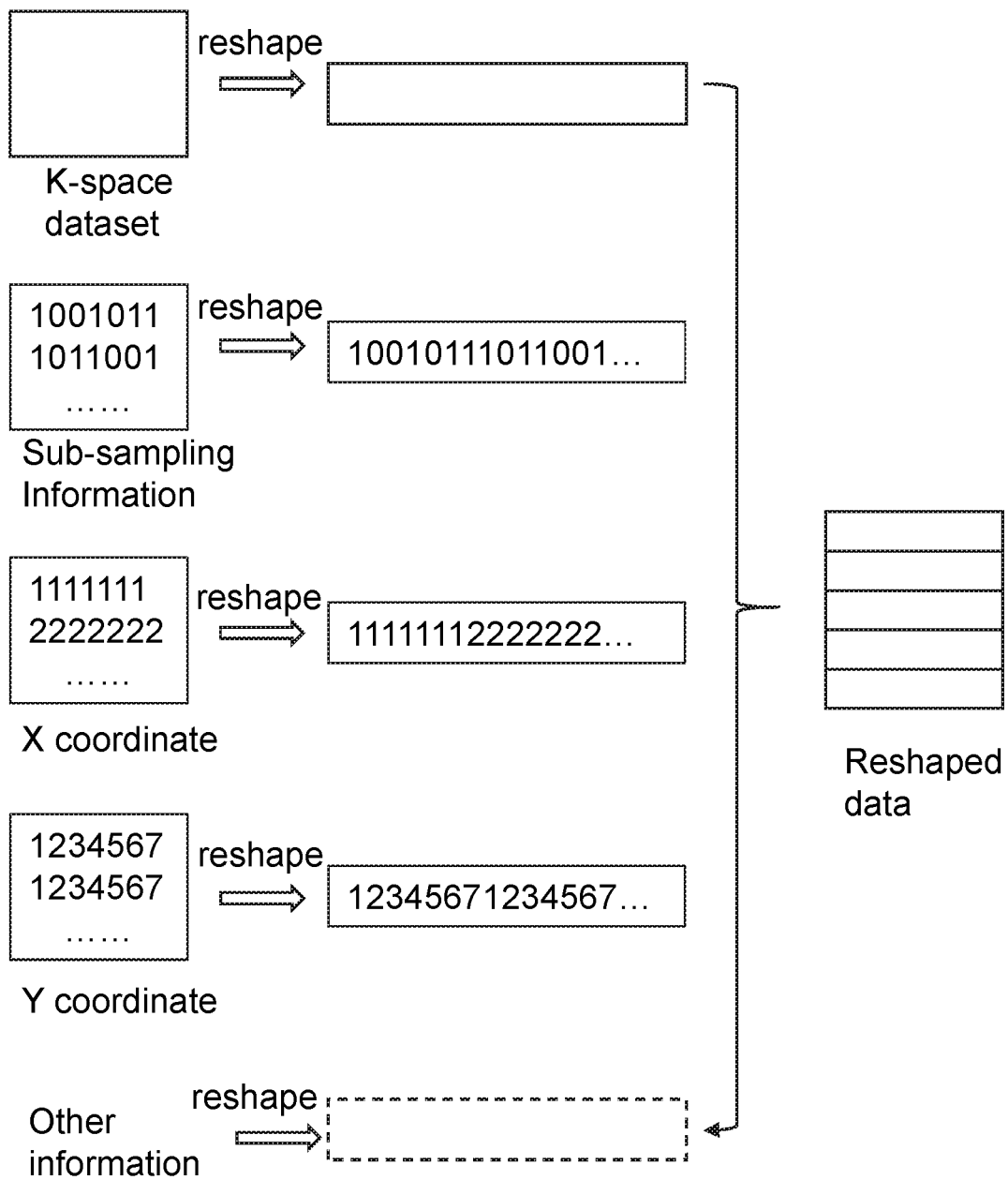
FIG. 10 is a schematic diagram illustrating an exemplary process for generating reshaped data including a series of data points based on a k-space dataset according to some embodiments of the present disclosure.

FIG. 10 is a schematic diagram illustrating an exemplary process for generating reshaped data including a series of data points based on a k-space dataset according to some embodiments of the present disclosure.

As illustrated in FIGS. 5-7, the processing device 140 may generate a vector including a series of data points by reshaping a plurality of data points in a k-space dataset to a row vector. Each of the series of data points may correspond to a data point in the k-space dataset. Additionally, the processing device 140 may also generate vector(s) with respect to additional information of the series of data points. Exemplary additional information may include sub-sampling information of the series of data points or a part thereof, location information of the series of data points or a part thereof, timing information of the series of data points or a part thereof, or the like, or any combination thereof. As shown in FIG. 10, the plurality of data points in the k-space dataset may be arranged in a matrix. The plurality of data points or a part thereof may be retrieved and/or reshaped as a row vector by row. In addition, the additional information or a part thereof may be arranged in a matrix and retrieved and/or reshaped as a row vector by row, respectively. Specifically, a matrix including the sub-sampling information or a part thereof may be retrieved and/or reshaped as a row vector by row. A matrix including location information (i.e., information regarding the x coordinate, information regarding the y coordinate) or a part thereof may be retrieved and/or reshaped as a row vector by row, respectively. A matrix including other information (e.g., information regarding the z coordinate, the timing information) or a part thereof may be retrieved and/or reshaped as a row vector by row. The processing device 140 may obtain reshaped data including the series of data points by concatenating the row vectors. The processing device 140 may obtain a reconstructed image by inputting the reshaped data into an image reconstruction model (e.g., the image reconstruction model as illustrated in FIGS. 4-9). For example, the reshaped data may be in the form of a vector, a matrix, a tensor, etc.

Having thus described the basic concepts, it may be rather apparent to those skilled in the art after reading this detailed disclosure that the foregoing detailed disclosure is intended to be presented by way of example only and is not limiting. Various alterations, improvements, and modifications may occur and are intended to those skilled in the art, though not expressly stated herein. These alterations, improvements, and modifications are intended to be suggested by this disclosure, and are within the spirit and scope of the exemplary embodiments of this disclosure.

Moreover, certain terminology has been used to describe embodiments of the present disclosure. For example, the terms "one embodiment," "an embodiment," and/or "some embodiments" mean that a particular feature, structure or characteristic described in connection with the embodiment is included in at least one embodiment of the present disclosure. Therefore, it is emphasized and should be appreciated that two or more references to "an embodiment" or "one embodiment" or "an alternative embodiment" in various parts of this specification are not necessarily all referring to the same embodiment. Furthermore, the particular features, structures or characteristics may be combined as suitable in one or more embodiments of the present disclosure.

Further, it will be appreciated by one skilled in the art, aspects of the present disclosure may be illustrated and described herein in any of a number of patentable classes or context including any new and useful process, machine, manufacture, or composition of matter, or any new and useful improvement thereof. Accordingly, aspects of the present disclosure may be implemented entirely hardware, entirely software (including firmware, resident software, micro-code, etc.) or combining software and hardware implementation that may all generally be referred to herein as a "unit," "module," or "system." Furthermore, aspects of the present disclosure may take the form of a computer program product embodied in one or more computer readable media having computer readable program code embodied thereon.

A non-transitory computer readable signal medium may include a propagated data signal with computer readable program code embodied therein, for example, in baseband or as part of a carrier wave. Such a propagated signal may take any of a variety of forms, including electro-magnetic, optical, or the like, or any suitable combination thereof. A computer readable signal medium may be any computer readable medium that is not a computer readable storage medium and that may communicate, propagate, or transport a program for use by or in connection with an instruction execution system, apparatus, or device. Program code embodied on a computer readable signal medium may be transmitted using any appropriate medium, including wireless, wireline, optical fiber cable, RF, or the like, or any suitable combination of the foregoing.

Computer program code for carrying out operations for aspects of the present disclosure may be written in any combination of one or more programming languages, including an object oriented programming language such as Java, Scala, Smalltalk, Eiffel, JADE, Emerald, C++, C#, VB. NET, Python or the like, conventional procedural programming languages, such as the "C" programming language, Visual Basic, Fortran 2003, Perl, COBOL 2002, PHP, ABAP, dynamic programming languages such as Python, Ruby and Groovy, or other programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider) or in a cloud computing environment or offered as a service such as a Software as a Service (SaaS).

Furthermore, the recited order of processing elements or sequences, or the use of numbers, letters, or other designations therefore, is not intended to limit the claimed processes and methods to any order except as may be specified in the claims. Although the above disclosure discusses through various examples what is currently considered to be a variety of useful embodiments of the disclosure, it is to be understood that such detail is solely for that purpose, and that the appended claims are not limited to the disclosed embodiments, but, on the contrary, are intended to cover modifications and equivalent arrangements that are within the spirit and scope of the disclosed embodiments. For example, although the implementation of various components described above may be embodied in a hardware device, it may also be implemented as a software only solution, e.g., an installation on an existing server or mobile device.

Similarly, it should be appreciated that in the foregoing description of embodiments of the present disclosure, various features are sometimes grouped together in a single embodiment, figure, or description thereof for the purpose of streamlining the disclosure aiding in the understanding of one or more of the various inventive embodiments. This method of disclosure, however, is not to be interpreted as reflecting an intention that the claimed subject matter requires more features than are expressly recited in each claim. Rather, inventive embodiments lie in less than all features of a single foregoing disclosed embodiment.

In some embodiments, the numbers expressing quantities, properties, and so forth, used to describe and claim certain embodiments of the application are to be understood as being modified in some instances by the term "about," "approximate," or "substantially." For example, "about," "approximate," or "substantially" may indicate ±20% variation of the value it describes, unless otherwise stated. Accordingly, in some embodiments, the numerical parameters set forth in the written description and attached claims are approximations that may vary depending upon the desired properties sought to be obtained by a particular embodiment. In some embodiments, the numerical parameters should be construed in light of the number of reported significant digits and by applying ordinary rounding techniques. Notwithstanding that the numerical ranges and parameters setting forth the broad scope of some embodiments of the application are approximations, the numerical values set forth in the specific examples are reported as precisely as practicable.

Each of the patents, patent applications, publications of patent applications, and other material, such as articles, books, specifications, publications, documents, things, and/or the like, referenced herein is hereby incorporated herein by this reference in its entirety for all purposes, excepting any prosecution file history associated with same, any of same that is inconsistent with or in conflict with the present document, or any of same that may have a limiting affect as to the broadest scope of the claims now or later associated with the present document. By way of example, should there be any inconsistency or conflict between the description, definition, and/or the use of a term associated with any of the incorporated material and that associated with the present document, the description, definition, and/or the use of the term in the present document shall prevail.

In closing, it is to be understood that the embodiments of the application disclosed herein are illustrative of the principles of the embodiments of the application. Other modifications that may be employed may be within the scope of the application. Thus, by way of example, but not of limitation, alternative configurations of the embodiments of the application may be utilized in accordance with the teachings herein. Accordingly, embodiments of the present application are not limited to that precisely as shown and described.

We Claim:

1. A system, comprising:
   at least one storage device including a set of instructions;
   at least one processor in communication with the at least one storage device, wherein when executing the set of instructions, the at least one processor is configured to cause the system to perform operations including:
      obtaining a k-space dataset according to magnetic resonance (MR) signals acquired by a magnetic resonance imaging (MRI) scanner;
      generating, based on the k-space dataset using an image reconstruction model that includes a sequence sub-model and a domain translation sub-model, a reconstructed image by:
         inputting at least a part of the k-space dataset into the sequence sub-model;
         outputting, from the sequence sub-model, a feature representation of the k-space dataset;
         inputting the feature representation of the k-space dataset into the domain translation sub-model; and
         outputting, from the domain translation sub-model, the reconstructed image.

2. The system of claim 1, wherein the inputting the at least a part of the k-space dataset into the sequence sub-model includes:
   reshaping the k-space dataset to a vector including a series of data points based on the k-space dataset; and
   sequentially inputting at least a part of the vector into the sequence sub-model.

3. The system of claim 2, wherein the at least one processor is further configured to cause the system to perform operations including:
   concatenating a vector, a second vector, a third vector. a fourth vector. and a fifth vector, wherein:
      the second vector includes sub-sampling information of data points of the at least a part of the vector;
      the third vector includes first coordinates of data points of the at least a part of the vector;
      the the fourth vector includes second coordinates of data points of the at least a part of the vector; or
      the fifth vector includes third coordinates of data points of the at least a part of the vector; and
   sequentially inputting at least a part of the concatenated vectors into the sequence sub-model.

4. The system of claim 3, wherein the sequentially inputting at least a part of the vector into the sequence sub-model includes:
   determining the at least a part of the vector by removing, from the series of data points and based on the sub-sampling information, data points of the vector corresponding to unsampled data points in the k-space dataset.

5. The system of claim 1, wherein the inputting at least a part of the k-space dataset into the sequence sub-model includes:
   inputting at least a part of the k-space dataset in a form of a vector, a matrix, or a tensor into the sequence sub-model.

6. The system of claim 1, wherein the image reconstruction model includes at least one of a recurrent neural network (RNN) model, a simple recurrent network (SRN) model, a gated sequence model, an LSTM network model, a stacked recurrent neural network (SRNN) model, a bi-directional recurrent network model, a recursive neural network (RecNN) model, a graph network model, a convolutional neural network (CNN) model, a transformer, a transformer XL, a bidirectional encoder representation from transformer (BERT), a fully convolutional neural network (FCN) model, a generative adversarial network (GAN) model, a back propagation (BP) neural network model, a radial basis function (RBF) neural network model, a deep belief nets (ABN) neural network model, or an Elman neural network model.

7. The system of claim 1, wherein the sequence sub-model and the domain translation sub-model include a skip-connection structure.

8. The system of claim 1, wherein the image reconstruction model is generated by a training process comprising:
   obtaining a plurality of training k-space datasets; and
   generating the image reconstruction model by training, based on the plurality of training k-space datasets, a preliminary image reconstruction model.

9. The system of claim 8, wherein the preliminary image reconstruction model includes a preliminary sequence sub-model and a preliminary domain translation sub-model, and the generating the image reconstruction model by training, based on the plurality of training k-space datasets includes:
   for each of at least one of the plurality of training k-space datasets,
      inputting at least a part of the training k-space dataset into an intermediate sequence sub-model that relates to the preliminary sequence sub-model;
      outputting, from the intermediate sequence sub-model, a training feature representation of the training k-space dataset;
      inputting the training feature representation of the training k-space dataset into an intermediate domain translation sub-model that relates to the preliminary domain translation sub-model;
      outputting, from the intermediate domain translation sub-model, a reconstructed training image;
      obtaining a comparison result by comparing the reconstructed training image and a reference reconstructed image corresponding to the training k- space dataset;

determining whether a predetermined condition is satisfied; and updating at least one of the intermediate sequence sub-model or the intermediate domain translation sub-model based on the comparison result; and obtaining the image reconstruction model in response to determining that the predetermined condition is satisfied.

10. The system of claim 9, wherein the image reconstruction model is further configured to reduce noise in a reconstructed image; and the generating the image reconstruction model by training, based on the plurality of training k-space datasets, a preliminary image reconstruction model includes:

reducing noise of the reference reconstructed image; and generating the image reconstruction model based on the reference reconstructed image with reduced noise.

11. A method for reconstructing an image, the method being implemented on a computing device having at least one processor, and at least one computer-readable storage medium, the method comprising:

obtaining a k-space dataset according to magnetic resonance (MR) signals acquired by a magnetic resonance imaging (MRI) scanner;

generating, based on the k-space dataset using an image reconstruction model that includes a sequence sub-model and a domain translation sub-model, a reconstructed image by:

inputting at least a part of the k-space dataset into the sequence sub- model;

outputting, from the sequence sub-model, a feature representation of the k-space dataset;

inputting the feature representation of the k-space dataset nto the domain translation sub-model; and outputting, from the domain translation sub-model, the reconstructed image.

12. The method of claim 11, wherein the inputting the at least a part of the k-space dataset into the sequence sub-model includes further comprising:

reshaping the k-space dataset to a vector including a series of data points based on the k-space dataset; and sequentially inputting at least a part of the vector into the sequence sub-model.

13. The method of claim 12, further comprising:

concatenating a vector, a second vector, a third vector, a fourth vector, and a fifth vector, wherein:

the second vector includes including sub-sampling information of data points of the at least a part of the vector;

the third vector includes first coordinates of data points of the at least a part of the vector;

the fourth vector includes second coordinates of data points of the at least a part of the vector; or the fifth vector includes third coordinates of data points of the at least a part of the vector; and sequentially inputting at least a part of the concatenated vectors into the sequence sub-model.

14. The method of claim 13, wherein the sequentially inputting at least a part of the vector into the sequence sub-model includes:

determining the at least a part of the vector by removing, from the series of data points and based on the sub-sampling information, data points of the vector corresponding to unsampled data points in the k-space dataset.

15. The method of claim 11, wherein the inputting at least a part of the k-space dataset into the sequence sub-model includes:

inputting at least a part of the k-space dataset in a form of a vector, a matrix, or a tensor into the sequence sub-model.

16. The method of claim 11, wherein the sequence sub-model and the domain translation sub-model include a skip-connection structure.

17. The method of claim 11, wherein the image reconstruction model is generated by a training process comprising:

obtaining a plurality of training k-space datasets; and generating the image reconstruction model by training, based on the plurality of training k-space datasets, a preliminary image reconstruction model.

18. The method of claim 17, wherein the preliminary image reconstruction model includes a preliminary sequence sub-model and a preliminary domain translation sub-model, and the generating the image reconstruction model by training, based on the plurality of training k-space datasets, a preliminary image reconstruction model includes:

for each of at least one of the plurality of training k-space datasets, inputting at least a part of the training k-space dataset into an intermediate sequence sub-model that relates to the preliminary sequence sub-model;

outputting, from the intermediate sequence sub-model, a training feature representation of the training k-space dataset;

inputting the training feature representation of the training k-space dataset into an intermediate domain translation sub-model that relates to the preliminary domain translation sub-model;

outputting, from the intermediate domain translation sub-model, a reconstructed training image;

obtaining a comparison result by comparing the reconstructed training image and a reference reconstructed image corresponding to the training k-space dataset;

determining whether a predetermined condition is satisfied; and updating at least one of the intermediate sequence sub-model or the intermediate domain translation sub-model based on the comparison result; and obtaining the image reconstruction model in response to determining that the predetermined condition is satisfied.

19. The method of claim 18, wherein the image reconstruction model is further configured to reduce noise in a reconstructed image; and the generating the image reconstruction model by training, based on the plurality of training k-space datasets, a preliminary image reconstruction model includes:

reducing noise of the reference reconstructed image; and generating the image reconstruction model based on the reference reconstructed image with reduced noise.

20. A non-transitory computer readable medium, comprising:

instructions being executed by at least one processor, causing the at least one processor to implement a method, the method comprising:

obtaining a k-space dataset according to magnetic resonance (MR) signals acquired by a magnetic resonance imaging (MRI) scanner;

generating, based on the k-space dataset using an image reconstruction model that includes a sequence sub-model and a domain translation sub-model, a reconstructed image by:

inputting at least a part of the k-space dataset into the sequence sub-model;

outputting, from the sequence sub-model, a feature representation of the k-space dataset;
inputting the feature representation of the k-space dataset into the domain translation sub-model; and
outputting, from the domain translation sub-model, the reconstructed image.

* * * * *